US008236577B1

(12) United States Patent
Hsu et al.

(10) Patent No.: US 8,236,577 B1
(45) Date of Patent: Aug. 7, 2012

(54) FOUNDRY COMPATIBLE PROCESS FOR MANUFACTURING A MAGNETO METER USING LORENTZ FORCE FOR INTEGRATED SYSTEMS

(75) Inventors: George Hsu, Menlo Park, CA (US); Xiao "Charles" Yang, Menlo Park, CA (US)

(73) Assignee: MCube Inc., San Jose, CA (US)

( * ) Notice: Subject to any disclaimer, the term of this patent is extended or adjusted under 35 U.S.C. 154(b) by 23 days.

(21) Appl. No.: 13/007,574

(22) Filed: Jan. 14, 2011

Related U.S. Application Data

(60) Provisional application No. 61/295,673, filed on Jan. 15, 2010.

(51) Int. Cl.
*H01L 21/00* (2006.01)

(52) U.S. Cl. .................. 438/3; 438/16; 438/57; 438/73; 438/455; 438/459; 331/154; 331/116 M; 331/117 D; 331/107 DP; 323/294; 323/368; 257/459; 257/E21.122; 257/E23.02; 257/E23.04; 37/1.22; 37/1.23; 37/1.24

(58) Field of Classification Search .................. None
See application file for complete search history.

(56) References Cited

U.S. PATENT DOCUMENTS

| 6,188,322 | B1 | 2/2001 | Yao et al. |
| 6,979,872 | B2 | 12/2005 | Borwick et al. |
| 7,195,945 | B1 * | 3/2007 | Edelstein et al. ............... 438/48 |
| 2004/0016995 | A1 | 1/2004 | Kuo et al. |
| 2004/0227201 | A1 | 11/2004 | Borwick, III et al. |
| 2005/0252293 | A1 | 11/2005 | Won et al. |
| 2006/0274399 | A1 * | 12/2006 | Yang .............................. 359/291 |
| 2008/0014682 | A1 | 1/2008 | Yang et al. |
| 2011/0265574 | A1 | 11/2011 | Yang |

OTHER PUBLICATIONS

International Search Report and Written Opinion of PCT Application No. PCT/US10/054567, mailed on Jan. 6, 2011, 7 pages total.
Office Action for U.S. Appl. No. 12/945,087, mailed on Mar. 19, 2012, 6 pages.

* cited by examiner

*Primary Examiner* — Charles Garber
*Assistant Examiner* — Yasser Abdelaziez
(74) *Attorney, Agent, or Firm* — Kilpatrick Townsend and Stockton LLP

(57) ABSTRACT

A method for fabricating an integrated electronic compass and circuit system. The fabrication method begins with providing a semiconductor substrate comprising a surface region. One or more CMOS integrated circuits are then formed on one or more portions of the semiconductor substrate. Once the CMOS circuits are formed, a thickness of dielectric material is formed overlying the one or more CMOS integrated circuits. A substrate is then joined overlying the thickness of the dielectric material. Once joined, the substrate is thinned to a predetermined thickness. Following the thinning process, an electric compass device is formed within one or more regions of the predetermined thickness of the substrate. Other mechanical devices or MEMS devices can also be formed within one or more regions of the thinned substrate.

20 Claims, 22 Drawing Sheets

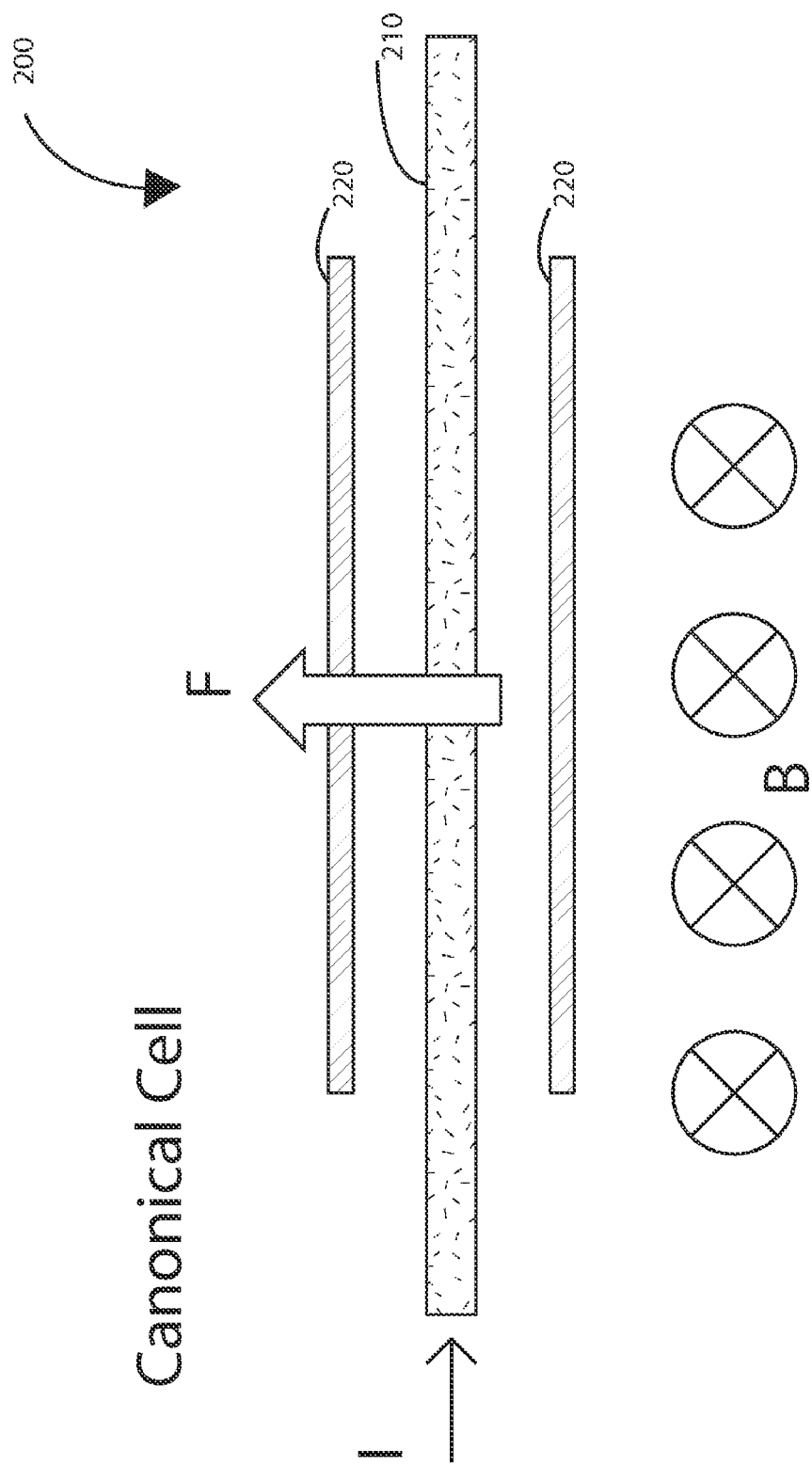

FOUNDRY COMPATIBLE PROCESS FOR MANUFACTURING A MAGNETO METER USING LORENTZ FORCE FOR INTEGRATED SYSTEMS

CROSS-REFERENCES TO RELATED APPLICATIONS

The present application claims priority to and incorporates by reference, for all purposes, the following pending patent application: U.S. Pat. App. No. 61/295,673, filed Jan. 15, 2010. The present invention also incorporates by reference, for all purposes, the following patent applications: U.S. patent application Ser. No. 12/859,631, filed Aug. 19, 2010, U.S. Pat. application Ser. No. 12/490,067, filed Jun. 23, 2009, U.S. patent application Ser. No. 12/957,222, filed Nov. 30, 2010, U.S. Pat. App. No. 61/367,032, filed Jul. 23, 2010, U.S. patent application Ser. No. 12/945,087, filed Nov. 12, 2010, and U.S. patent application Ser. No. 12/913,440, filed Oct. 27, 2010.

BACKGROUND OF THE INVENTION

Embodiments of the present invention relates generally to electronic and mechanical devices technologies. More particularly, embodiments of the present invention provide a method for fabricating an electronic compass device that is preferably integrated with one or more integrated circuits and other micro-electrical mechanical systems, commonly termed MEMS. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that embodiments of the invention have a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to electronic and mechanical devices are provided. More particularly, the present invention provides a method of fabricating an electronic compass that is preferably integrated with one or more integrated circuits and other micro-electrical mechanical systems, commonly termed MEMS, manufactured using a foundry compatible process. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

In a specific embodiment, the present invention provides a method for fabricating an integrated electronic compass and circuit system. The fabrication method begins with providing a semiconductor substrate comprising a surface region. One or more CMOS integrated circuits are then formed on one or more portions of the semiconductor substrate. Once the CMOS circuits are formed, a thickness of dielectric material is formed overlying the one or more CMOS integrated circuits. A substrate is then joined overlying the thickness of the dielectric material. Once joined, the substrate is thinned to a predetermined thickness. Following the thinning process, an electric compass device is formed within one or more regions of the predetermined thickness of the substrate. The system includes a semiconductor substrate and one or more CMOS integrated circuits formed on one or more portions of the semiconductor substrate. The system has an electronic compass device operably coupled to the one or more CMOS integrated circuits.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved CMOS integrated circuit device and related methods for a variety of uses. Depending upon the embodiment, one or more of these benefits may be achieved.

These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 2A and 2B are simplified diagram of a model and circuit system of an electronic compass according to an embodiment of the present invention;

DETAILED DESCRIPTION OF THE INVENTION

According to the present invention, techniques related generally to electronic and mechanical devices are provided. More particularly, the present invention provides a method of fabricating an electronic compass that is preferably integrated with one or more integrated circuits and other micro-electrical mechanical systems, commonly termed MEMS. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1A:
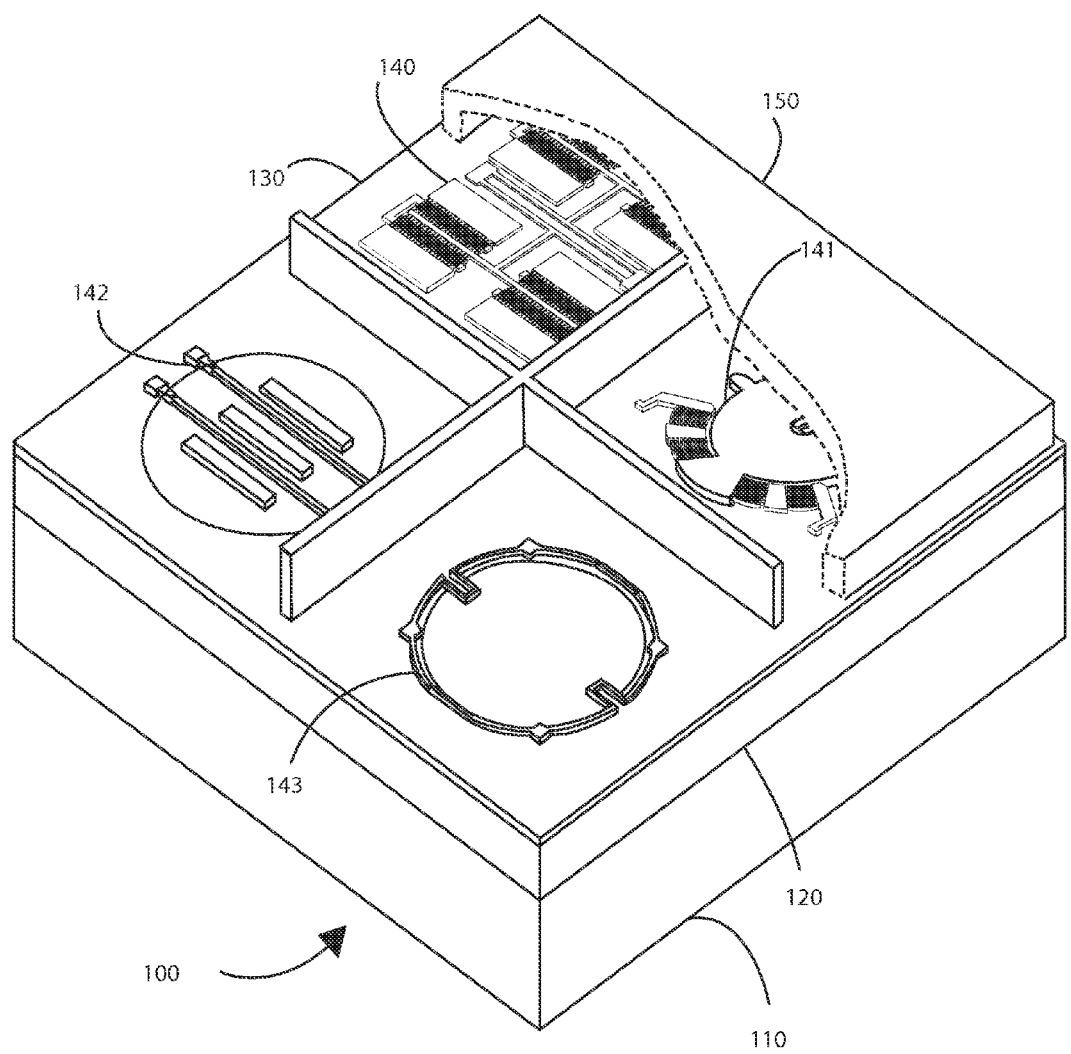
FIG. 1A is a simplified perspective diagram of an integrated MEMS and circuit system according to an embodiment of the present invention.

FIG. 1A is a simplified perspective diagram of an integrated MEMS and circuit system according to an embodiment of the present invention. This diagram is merely an example, which should not unduly limit the scope of the claims herein. One of ordinary skill in the art would recognize other variations, modifications, and alternatives. As shown, system 100 includes a substrate layer 110, a semiconductor layer 120, integrated devices 140-143, and an encapsulation layer 150. In a specific embodiment, each of devices 140-143 can include a MEMS device; FIG. 1 depicts the integrated system as having an accelerometer 140, a gyroscope 141, a magnetic sensor 142, and a pressure sensor 143, among others. These MEMS devices are integrated with common semiconductor layer 120 on top of common substrate layer 110 and are covered by encapsulation layer 150, although there may be fewer or more devices in other embodiments. In an embodiment, common semiconductor layer 120 can be made of a silicon material or any other appropriate semiconductor. Semiconductor layer 120 can include a CMOS layer or any other appropriate layer for implementing microelectronics. CMOS layer 120 includes a surface region which forms an interface region 130, on which devices 140-143 can be configured. Further details of various integration techniques of the component layers and devices are provided below.

In various embodiments, MEMS devices 140-143 can include any combination of MEMS devices. These can include accelerometers, gyroscopes, microphones, sensors, and others. Though not exclusively, the sensors can by any of the following types: magnetic, pressure, humidity, temperature, chemical, biological, or inertial. In further embodiments, any number of MEMS devices can be included in integrated system 100, and each of these devices can comprise one or more deposited materials, one or more bonded materials, or others. Of course, there can be other variations, modifications, and alternatives.

In various embodiments, semiconductor layer 120 can include a CMOS layer comprised of any number of metal layers and can be provided on any type of design rule, such as a 0.18 micron design rule (or 0.11 micron or 90 nm or 70 nm or 55 nm) or less. Also, interface region 130 formed by the semiconductor layer can be integrated with any number of CMOS devices, which can be configured from a foundry compatible process, such as those of semiconductor foundry operations of Taiwan Semiconductor Manufacturing Corporation, and others. In other embodiments, the CMOS devices can be manufactured using other suitable processes. Devices 140-143, and possibly additional devices, can all be configured individually in separate portions of interface region 130. In further embodiments, MEMS devices 140-143, and additional devices, and comprise an upper surface region that faces away from CMOS layer 120 and devices. One skilled in the art would recognize other variations, modifications, and alternatives.

In various embodiments, overlying encapsulation layer 150 can include a chip scale packaging (CSP) layer, such as a wafer level chip scale package (WL-CSP), also known as a wafer level package (WLP). Any other CSP method may be substituted if deemed appropriate by those skilled in the art. Additionally, CSP layer 150 can be configured to hermetically seal any number of the integrated devices on interface region 130. Again, there can be many other variations, modifications, and alternatives.

The present technique provides an easy to use process that relies upon conventional technology. This technique can reduce off-chip connections, which makes the mass production of smaller and thinner units possible. Also, integrated MEMS and circuit technology can achieve high accuracy through the minimization of parasitic resistances and capacitances due to integrated fabrication techniques. In some embodiments, the method provides higher device yields in dies per wafer with the integrated approach. Additionally, the method provides a process and system that are compatible with conventional process technology without substantial modifications to conventional equipment and processes.

It is also understood that the examples and embodiments described herein are for illustrative purposes only and that various modifications or changes in light thereof will be suggested to persons skilled in the art and are to be included within the spirit and purview of this application and scope of the appended claims. Further details of the integration of CMOS and MEMS devices can be found throughout the present specification and more particularly below.

Figure 1B:
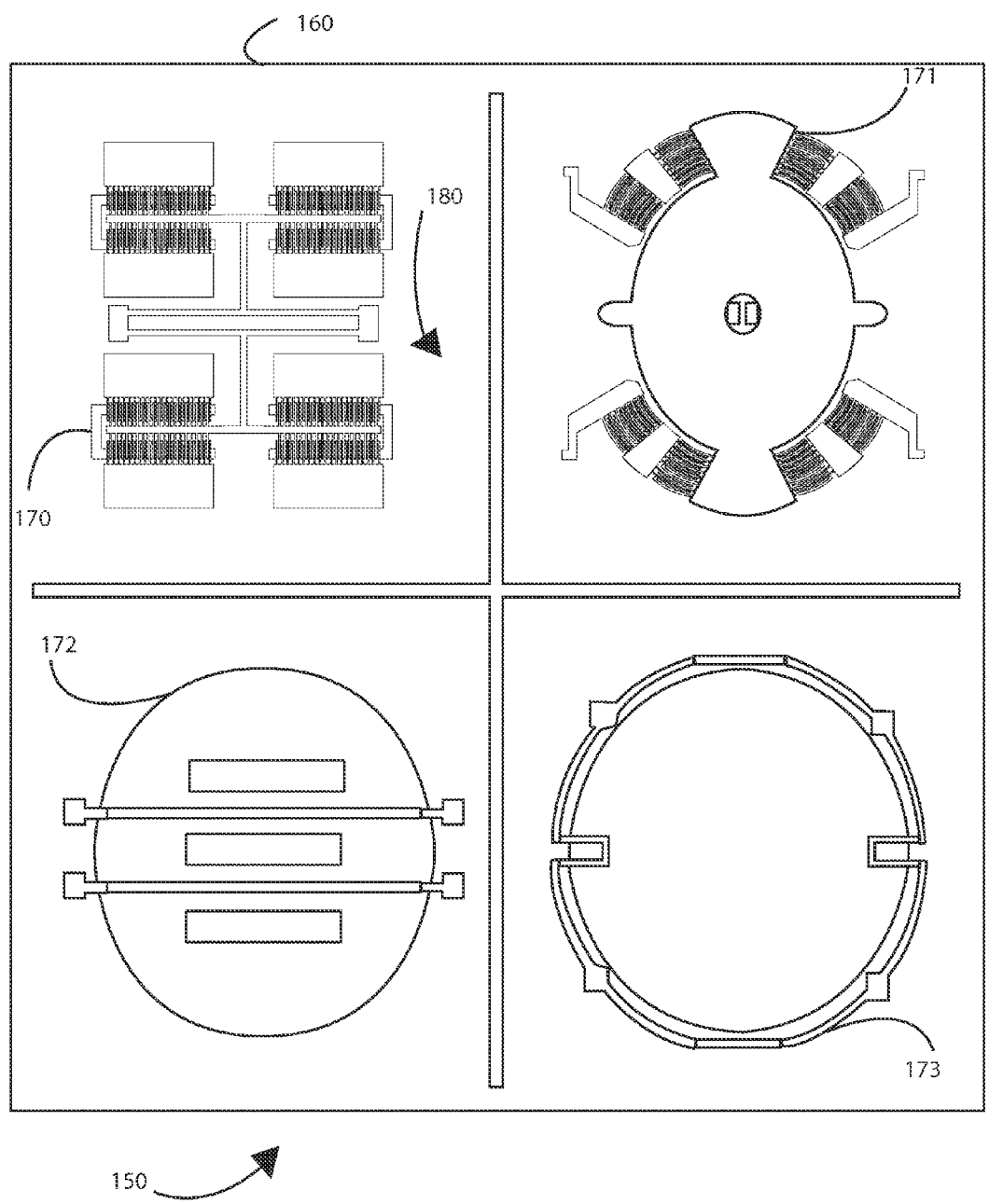
FIG. 1B is a simplified top diagram of an integrated MEMS and circuit system according to an embodiment of the present invention.

FIG. 1B is a simplified top diagram of an integrated MEMS and circuit system according to an embodiment of the present invention. This diagram is merely an example, which should not unduly limit the scope of the claims herein. One of ordinary skill in the art would recognize other variations, modifications, and alternatives. As shown, system 150 includes a semiconductor layer 160, devices 170-173, and an interface region 180. Of course, there can be other variations, modifications, and alternatives. In a specific embodiment, the each of the devices 170-173 can include a MEMS device; FIG. 1B depicts the integrated system 150 as having an accelerometer 170, a gyroscope 171, a magnetic sensor 172, and a pressure sensor 173, and possibly other devices, and combinations. These MEMS devices are integrated with common semiconductor layer 160. In an embodiment, common semiconductor layer 160 can be made of a silicon material or any other appropriate semiconductor. Semiconductor layer 160 can include a CMOS layer or any other appropriate layer for implementing microelectronics. CMOS layer 160 includes a surface region which forms an interface region 180, on which devices 170-173 can be configured.

In various embodiments, MEMS devices 170-173 can include any combination of MEMS devices. These can include accelerometers, gyroscopes, microphones, sensors, and others. Though not exclusively, the sensors can by any of the following types: magnetic, pressure, humidity, temperature, chemical, biological, or inertial. In further embodiments, any number of MEMS devices can be included in integrated system 150, and each of these devices can comprise one or more deposited materials, one or more bonded materials, or others. Of course, there can be other variations, modifications, and alternatives.

In various embodiments, semiconductor layer 160 can include a CMOS layer comprised of any number of metal layers and can be provided on any type of design rule, such as a 0.18 micron design rule or less. Also, interface region 180 formed by the semiconductor layer can be integrated with any number of CMOS devices, which can be configured from a foundry compatible process. Devices 170-173, and possibly additional devices, can all be configured individually in separate portions of interface region 180. In further embodiments, MEMS devices 170-173, and additional devices, and comprise an upper surface region that faces away from CMOS layer 160 and devices. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims. Further details of the magnetic devices can be found throughout the present specification and more particularly below.

As background information, we have described a general principle of a Lorentz force based magnetic sensor that takes advantage of the physical force exerted upon a conductor carrying a current vector within a magnetic field vector. The force exerted on the conductor is then given by the vector cross product of the two constituent vectors. If the current vector through the conductor is controlled by a current source, then the magnetic field vector can be calculated if a force measuring means is provided to measure the force that is physically exerted upon the conductor by the Lorentz force. In principle, the approach should lend itself well to the fabrication techniques employed in MEMS processing that are used to fabricate accelerometers, gyroscopes, tuning fork oscillators and pressures sensors. In practice, however, a challenge lies within creating MEMS structures that are sensitive enough to be able to measure the magnetic field increment necessary for useful applications, such as electronic compassing. Furthermore, MEMS structures created to work for magnetic fields in the Z axis do not lend themselves well to the MEMS fabrication capabilities necessary for implementation within the X and Y axes and vice versa. It is in light of these challenges, that the present invention is unique and is believed to overcome these and other limitations.

FIG. 2A is a simplified diagram of a model of an electronic compass according to an embodiment of the present invention. This diagram is merely an example, which should not unduly limit the scope of the claims herein. One of ordinary skill in the art would recognize other variations, modifications, and alternatives. As shown is a long wire coupled 210 between a pair of sensing elements 220. Wire 210 is configured with electrical current (I) and is subjected to a gravitational field. Movement causes force (F). In a specific embodiment, when a current is passed through long straight wire 210 lying within the magnetic field that has an orthogonal component to the direction of the current flow, the Lorentz force acts upon wire 210 as the result of the cross product between the direction of the current flow and the direction of the magnetic field. Wire 210 is constructed so as to be free to move and its physical displacement is measured. This measured physical displacement is proportional to the strength of the magnetic field. The freely moving wire can be a highly doped silicon MEMS spring structure or the like whose geometry is selected in order to carry the signal current the maximum length possible within the direction necessary in order to measure the desired magnetic field component in the direction of interest, and whose movement mode maximizes the displacement distance in the direction of the resultant Lorentz force. Displacement, and therefore detectable signal strength, can be further enhanced if the current is comprised of a time alternating signal whose frequency is chosen to match the natural resonant frequency of the spring structure current carrying wire. The detection means can either one or a combination of capacitance sensing, piezo-resistance sensing, optical sensing, or any other means of sensing the displacement distance of a moveable structure. Further details of the present device and related methods are described throughout the present specification and more particularly below.

Figure 2B:
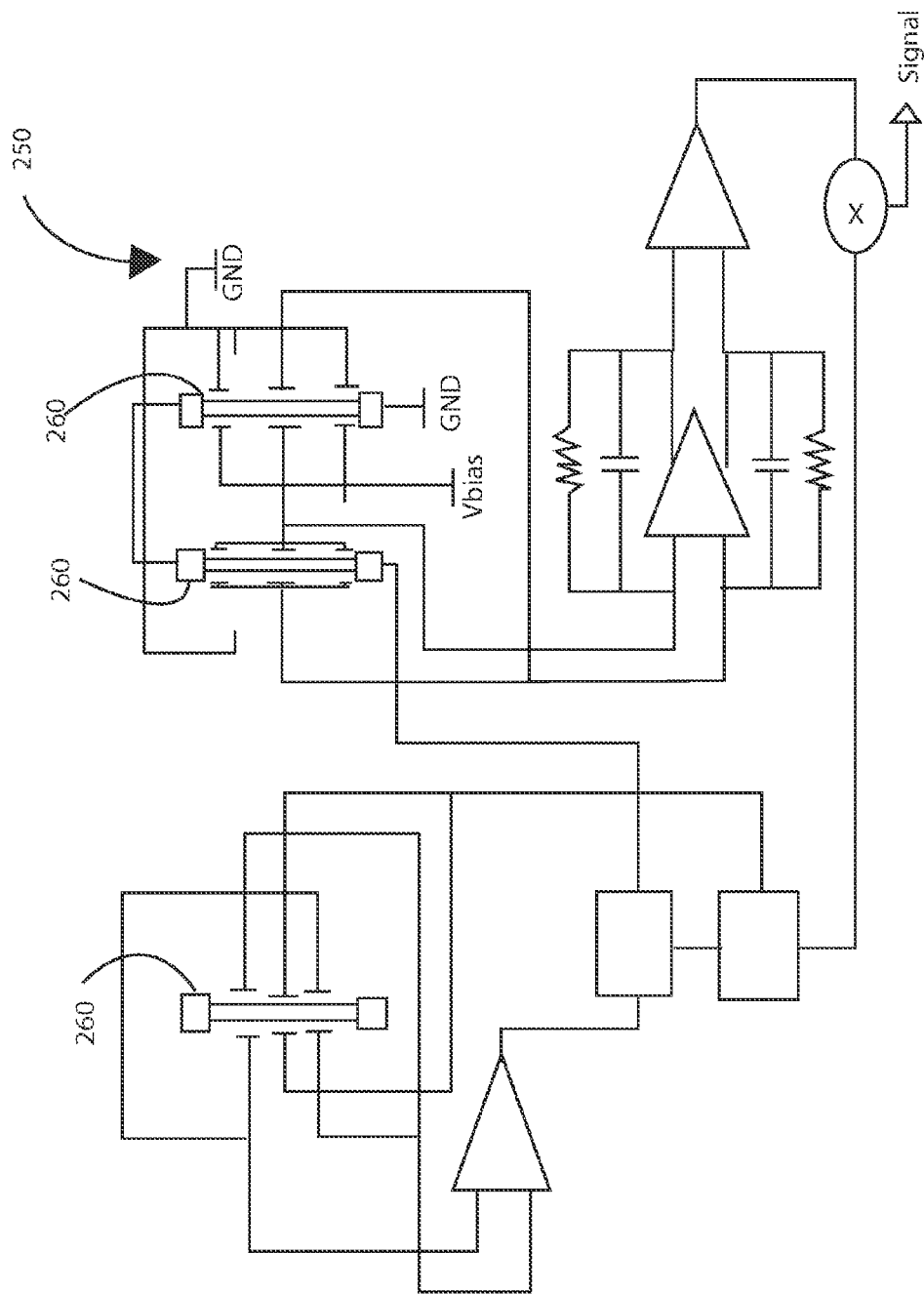

FIG. 2B is a simplified diagram of a circuit configuration of a electronic compass according to an embodiment of the present invention. This diagram is merely an example, which should not unduly limit the scope of the claims herein. One of ordinary skill in the art would recognize other variations, modifications, and alternatives. As shown in a preferred embodiment of the present invention, the present system 250 includes a MEMS clamped-clamped elongated resonating bar structure 260 that acts as a flat leaf spring or other like configuration. In one or more embodiments, three identical MEMS structures are required at a minimum, but there can be more or fewer. One of the structures is used solely as a timing element in a harmonic oscillator configuration in order to produce a timing current signal, which is then amplified and buffered and fed into the detector resonant structures.

In one or more embodiments, the two detector or sense resonant structures are aligned to be anti-parallel to each other and carry the same excitation current in series. The electrodes affixed about the reference resonating bar contain both a set of excitation electrodes and a set of sense electrodes, while the detector resonator structures contain only sense electrodes. In a preferred embodiment, the sense electrodes are configured to measure the change in capacitance caused by the maximum displacement of the resonating detector structures, which would only be non-zero whenever there was a non-zero value of the cross product of the two aforementioned vectors of current flow and magnetic field. Because the current flow would be in opposite directions through the series connected detector resonator structures, all signals or perturbations which were non magnetic in nature such as gravitational pull, shock, vibration and thermal effects would create displacements in both structures in the same direction, while the Lorentz force would only create displacements in opposing directions. Thus, when the signals from the two structures are differenced, all common mode perturbations are rejected while only magnetic signal induced signals remain. As a further enhancement to the present invention, the reference oscillator structure would be purposely fabricated with a softer spring constant than the detector oscillator structures, while biasing electrodes are placed at their flex points whereby the individual spring constants can be electrically softened, such that the quality factors for each individual structure can be fine tuned by phase lock looping the softening electrodes to always match the resonant frequency of the reference electrode. Thus, structures with extremely high quality factor gains can be used so that mechanical gain of a high quality factor can be leveraged to cause the maximum displacement for the smallest given Lorentz excitation force. In the preferred embodiment of the present invention, the reference oscillator signal is also used directly to AM demodulate the sensed structure signals to output a DC voltage proportional to the applied magnetic field.

In a specific embodiment, the sense direction of a Z-axis measurement embodiment of the present invention needs to have the sense electrodes in the horizontal plain with respect to the sensing structures, while the sense direction of an X or Y structure needs to be in the vertical plain with respect to the sensing directions. In order to maintain the common mode configurations of the sensed elements, the X and Y structures need to be excited in a teeter-totter mode, which is a higher order mode than the fundamental mode that the Z-axis sensor is operated in. Of course, there can be other variations, modifications, and alternatives.

Figure 3A:
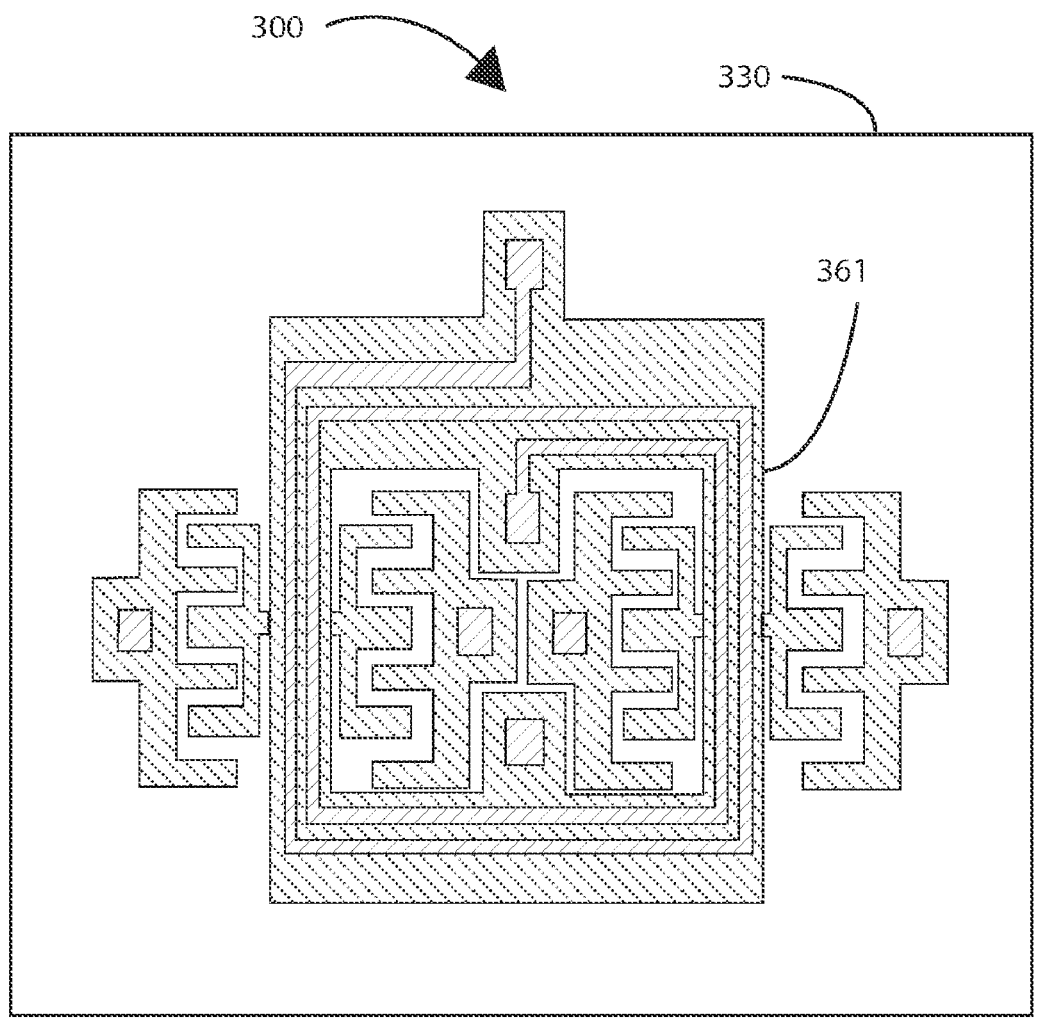
FIG. 3A is a simplified perspective diagram of an electronic compass configuration according to an embodiment of the present invention.

FIG. 3A is a simplified top diagram of an electronic compass configuration according to an embodiment of the present invention. This diagram is merely an example, which should not unduly limit the scope of the claims herein. One of ordinary skill in the art would recognize other variations, modifications, and alternatives. As shown, system 300 includes an interface region 330 and an electronic compass configuration 361. One of ordinary skill in the art will recognize other variations, modifications, and alternatives.

In an embodiment, the electronic compass configuration includes movable plates and electrodes. Each of the movable plates can be configured with an oscillating current signal. In a specific embodiment, the plates can be subjected to an external magnetic field, which can cause an output of a capacitance measurement between the electrodes. In an embodiment, the external magnetic field causes the moving plates to defect in a direction perpendicular to the magnetic field and the oscillating current signal. Additionally, each of the electrodes can be configured to be drive devices or sensing devices. In various embodiments, the plates can output a reference current that can be provided for one or more sensing devices. Additionally, those electrodes configured to be sensing devices can include one or more amplifier devices, which can be configured to output one or more DC signals. Of course, there can be other variations, modifications, and alternatives.

In various embodiments, the semiconductor layer can include a CMOS layer comprised of any number of metal layers and can be provided on any type of design rule, such as a 0.18 micron design rule (or 0.11 micron or 90 nm or 70 nm or 55 nm) or less. Also, interface region 1030 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3B:
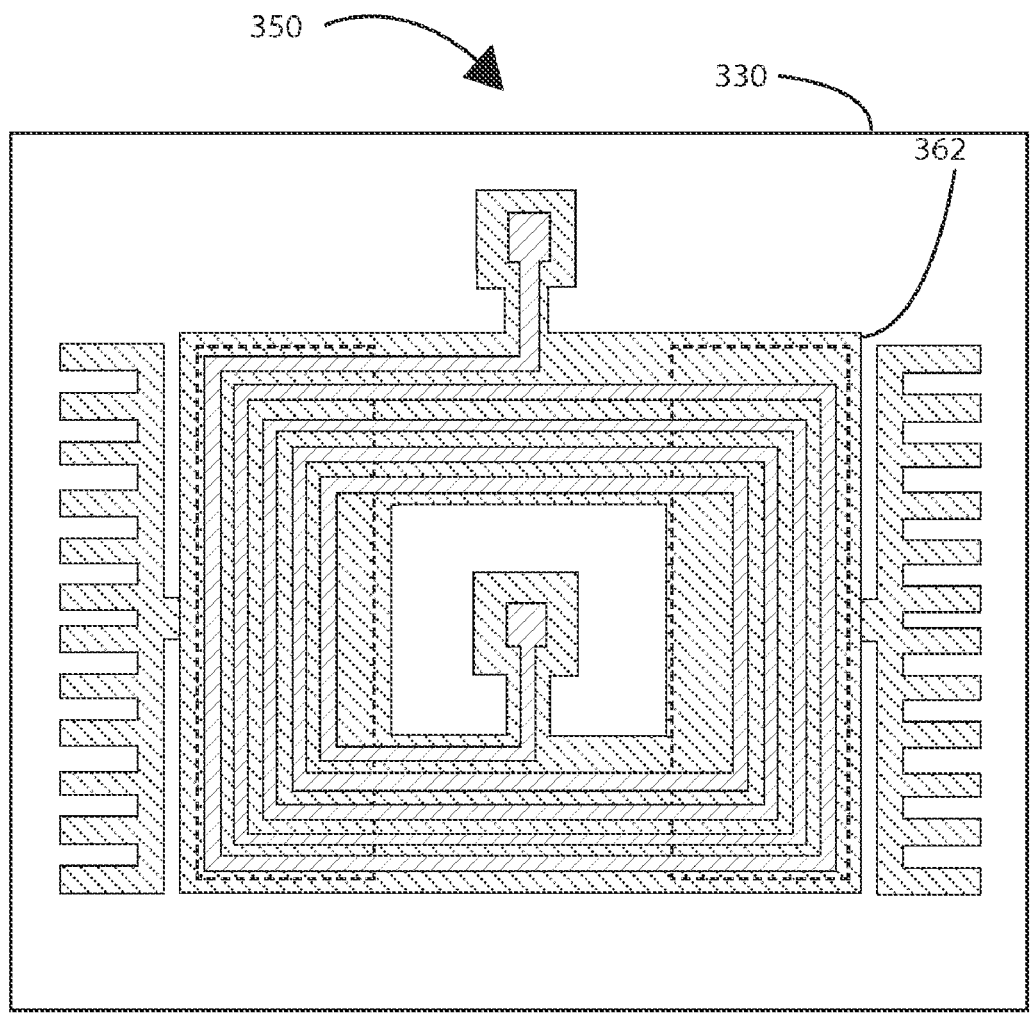
FIG. 3B is a simplified perspective diagram of an electronic compass configuration according to an embodiment of the present invention.

FIG. 3B is a simplified top diagram of an electronic compass configuration according to an embodiment of the present invention. This diagram is merely an example, which should not unduly limit the scope of the claims herein. One of ordinary skill in the art would recognize other variations, modifications, and alternatives. As shown, system 300 includes an interface region 330 and an electronic compass configuration 361. One of ordinary skill in the art will recognize other variations, modifications, and alternatives.

In an embodiment, the electronic compass configuration includes movable plates and electrodes. Each of the movable plates can be configured with an oscillating current signal. In a specific embodiment, the plates can be subjected to an external magnetic field, which can cause an output of a capacitance measurement between the electrodes. In an embodiment, the external magnetic field causes the moving plates to defect in a direction perpendicular to the magnetic field and the oscillating current signal. Additionally, each of the electrodes can be configured to be drive devices or sensing devices. In various embodiments, the plates can output a reference current that can be provided for one or more sensing devices. Additionally, those electrodes configured to be sensing devices can include one or more amplifier devices, which can be configured to output one or more DC signals. Of course, there can be other variations, modifications, and alternatives.

In various embodiments, the semiconductor layer can include a CMOS layer comprised of any number of metal layers and can be provided on any type of design rule, such as a 0.18 micron design rule (or 0.11 micron or 90 nm or 70 nm or 55 nm) or less. Also, interface region 1030 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
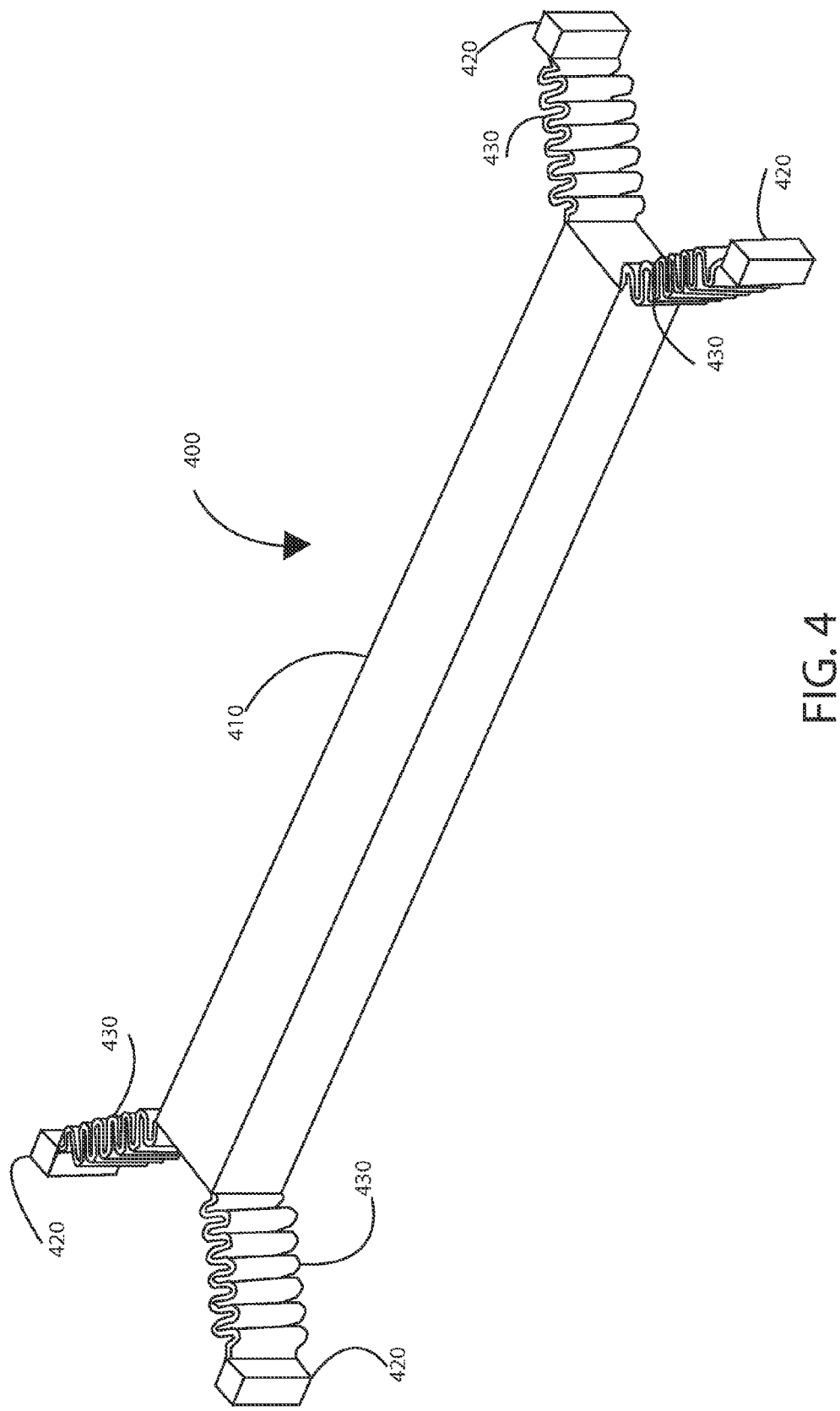
FIG. 4 is a simplified diagram of an electronic compass using a Lorentz force configuration according to an embodiment of the present invention.

FIG. 4 is a simplified diagram of an electronic compass using a Lorentz force configuration according to an embodiment of the present invention. This diagram is merely an example, which should not unduly limit the scope of the claims herein. As shown, device 400 includes an electronic compass configuration. The electronic compass configuration can have a movable element 410, one or more anchors 420, and one or more spring structures 430. One of ordinary skill in the art would recognize other variations, modifications, and alternatives.

Figure 5:
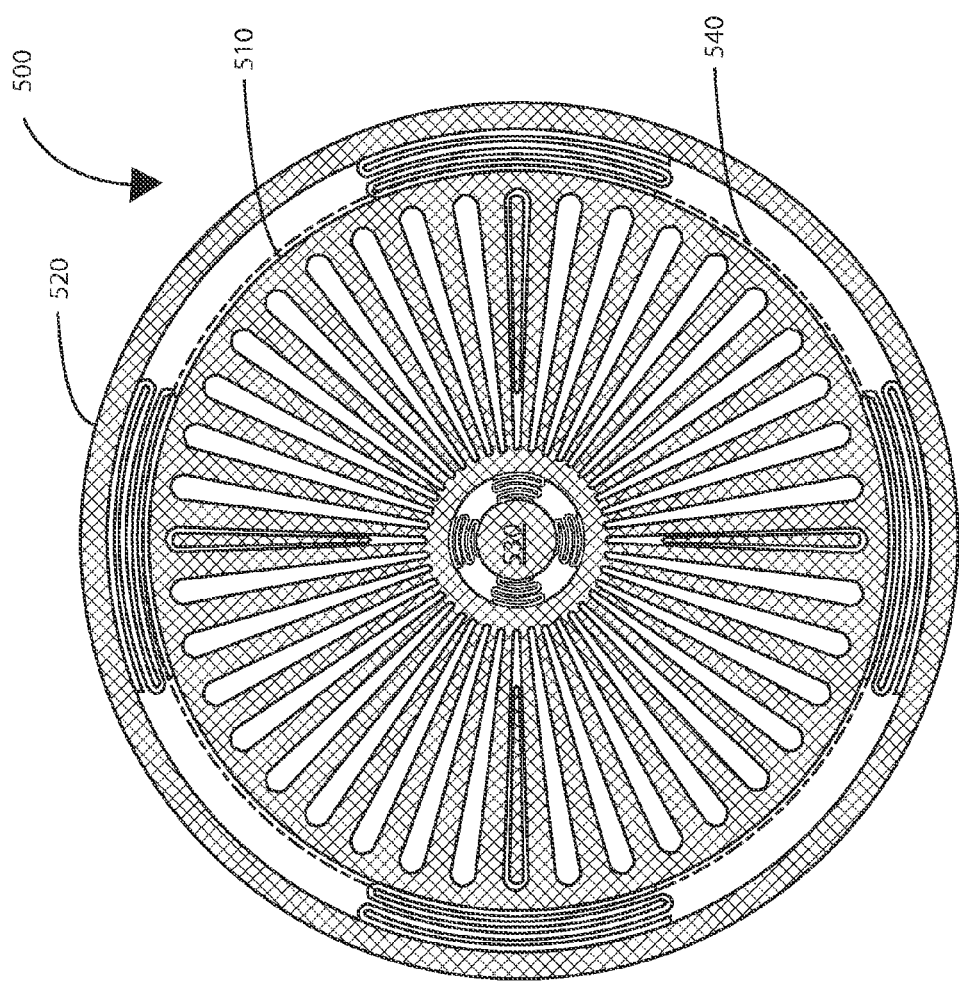
FIG. 5 is a simplified diagram of an electronic compass using a Lorentz force configured as a circular array according to an embodiment of the present invention.

FIG. 5 is a simplified diagram of an electronic compass using a Lorentz force configured as a circular array according to an embodiment of the present invention. This diagram is merely an example, which should not unduly limit the scope of the claims herein. One of ordinary skill in the art would recognize other variations, modifications, and alternatives. As shown is the circular array 500, which include additional or fewer support structures and/or spoke plates according to one or more embodiments. Of course, there can be other variations, modifications, and alternatives.

In an embodiment, the electronic compass configuration includes a plurality of electronic compass devices. Each of the electronic compass devices can include a movable plate 510, a first sensing plate 520, a second sensing plate 530, and a hub region 540. In various embodiments, first sensing plate 520 can be coupled to movable plate 510, and second sensing plate 530 can be coupled to movable plate 510. Also, hub region 540 can be coupled to each of the electronic compass devices. Of course, there can be other variations, modifications, and alternatives.

In various embodiments, the plurality of electronic compass devices can be coupled to one or more CMOS integrated circuits. Also, the electronic compass devices and one or more CMOS integrated circuits can be coupled to an accelerometer device. In a specific embodiment, the electronic compass configuration can be a micro-mechanical electronic system, which can be coupled to one or more amplifier devices. Those skilled in the art will recognize other variations, modifications, and alternatives.

In an embodiment, the movable plate of each electronic device can be operably coupled between at least a pair of electrodes. The movable plate of each compass device can be configured with an oscillating current signal. Also, the movable plate of each compass can be subjected to an external magnetic field to cause output of a capacitance measurement between each pair of electrodes. In a specific embodiment, the external magnetic field can cause the movable plate of each electronic compass device to defect in a direction perpendicular to the magnetic field and the oscillating current signal. In various embodiments, the movable plate of each electronic compass device is configured for outputting a reference current, which can be provided to one or more sensing devices. In a specific embodiment, the one or more sensing devices can be coupled to one or more amplifier devices, which can be configured to output one or more DC signals. Of course, those skilled in the art will recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 6:
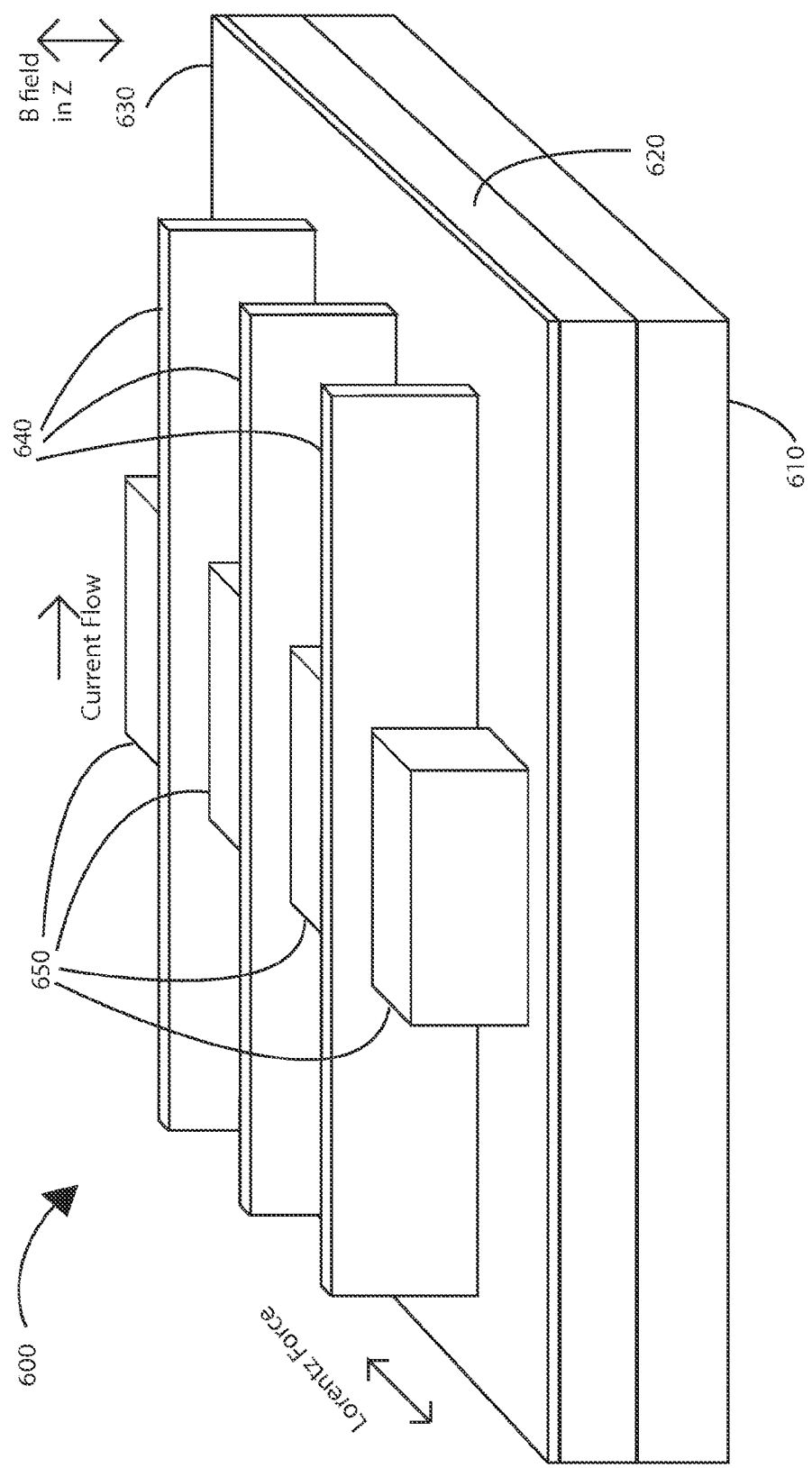
FIG. 6 is a simplified perspective diagram of an electronic compass configuration according to an embodiment of the present invention.

FIG. 6 is a simplified perspective diagram of an electronic compass configuration according to an embodiment of the present invention. This diagram is merely an example, which should not unduly limit the scope of the claims herein. One of ordinary skill in the art would recognize other variations, modifications, and alternatives. As shown, system 600 includes a substrate layer 610, a semiconductor layer 620, and an electronic compass configuration. One of ordinary skill in the art will recognize other variations, modifications, and alternatives.

In an embodiment, the electronic compass configuration includes movable electrode plates 640 and fixed electrodes 650. Each of movable plates 640 can be configured with an oscillating current signal. In a specific embodiment, plates 640 can be subjected to an external magnetic field, which can cause an output of a capacitance measurement between electrodes 630. In an embodiment, the external magnetic field causes moving plates 640 to defect in a direction perpendicular to the magnetic field and the oscillating current signal. Additionally, each of electrodes 630 can be configured to be drive devices or sensing devices. In various embodiments, plates 640 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

Plates 640 and electrodes 650 are integrated with common semiconductor layer 620 on top of common substrate layer 610. In an embodiment, common semiconductor layer 620 can be made of a silicon material or any other appropriate semiconductor. Semiconductor layer 620 can include a CMOS layer or any other appropriate layer for implementing microelectronics. CMOS layer 620 includes a surface region which forms an interface region 630, on which the electronic compass can be configured. In various embodiments, plates 640 can be 200 microns long, 2 microns wide, and 30 microns tall. The gap between moving electrodes 640 and fixed electrodes 650 can be 2 microns across. In a specific embodiment, there can be 40 parallel moving electrode plates 640. Further details of various integration techniques of the component layers and devices are provided below.

In various embodiments, semiconductor layer 620 can include a CMOS layer comprised of any number of metal layers and can be provided on any type of design rule, such as a 0.18 micron design rule (or 0.11 micron or 90 nm or 70 nm or 55 nm) or less. Also, interface region 630 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 7:
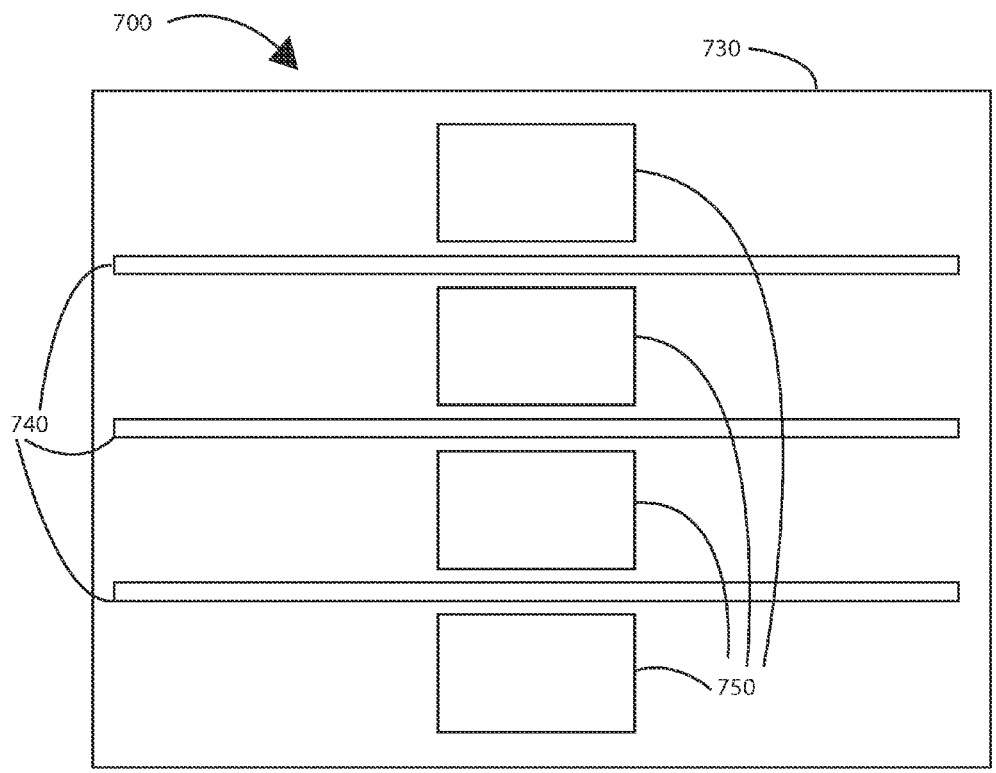
FIG. 7 is a simplified top diagram of an electronic compass configuration according to an embodiment of the present invention.

FIG. 7 is a simplified top diagram of an electronic compass configuration according to an embodiment of the present invention. This diagram is merely an example, which should not unduly limit the scope of the claims herein. One of ordinary skill in the art would recognize other variations, modifications, and alternatives. As shown, system 700 includes an electronic compass configuration. One of ordinary skill in the art will recognize other variations, modifications, and alternatives.

In an embodiment, the electronic compass configuration includes movable plates 740 and electrodes 750. Each of movable plates 740 can be configured with an oscillating current signal. In a specific embodiment, plates 740 can be subjected to an external magnetic field, which can cause an output of a capacitance measurement between electrodes 730. In an embodiment, the external magnetic field causes moving plates 740 to defect in a direction perpendicular to the magnetic field and the oscillating current signal. Additionally, each of electrodes 730 can be configured to be drive devices or sensing devices. In various embodiments, plates 740 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

Plates 740 and electrodes 750 are integrated with the common semiconductor layer on top of the common substrate layer. In an embodiment, the common semiconductor layer can be made of a silicon material or any other appropriate semiconductor. The semiconductor layer can include a CMOS layer or any other appropriate layer for implementing microelectronics. The CMOS layer includes a surface region which forms an interface region 730, on which the electronic compass can be configured. Further details of various integration techniques of the component layers and devices are provided below.

In various embodiments, the semiconductor layer can include a CMOS layer comprised of any number of metal layers and can be provided on any type of design rule, such as a 0.18 micron design rule (or 0.11 micron or 90 nm or 70 nm or 55 nm) or less. Also, interface region 730 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 8:
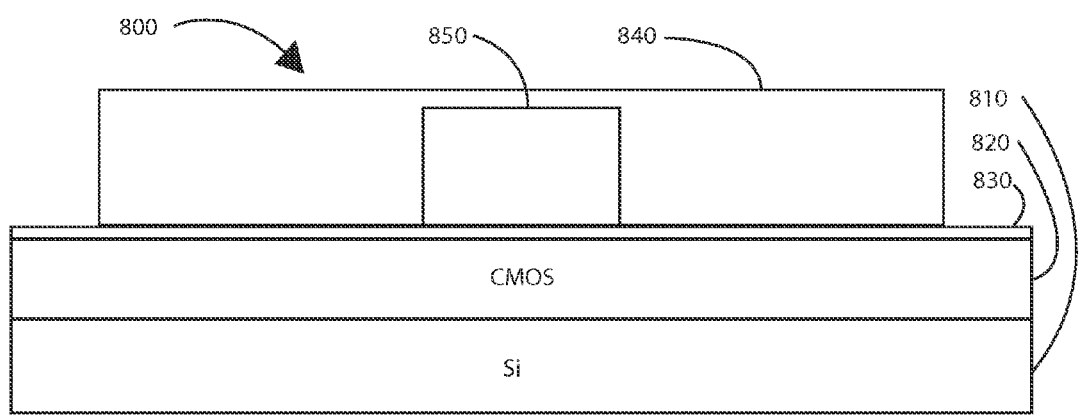
FIG. 8 is a simplified side diagram of an electronic compass configuration according to an embodiment of the present invention.

FIG. 8 is a simplified side diagram of an electronic compass configuration according to an embodiment of the present invention. This diagram is merely an example, which should not unduly limit the scope of the claims herein. One of ordinary skill in the art would recognize other variations, modifications, and alternatives. As shown, system 800 includes a substrate layer 810, a semiconductor layer 820, and an electronic compass configuration. One of ordinary skill in the art will recognize other variations, modifications, and alternatives.

In an embodiment, the electronic compass configuration includes movable plates 840 and electrodes 850. Each of movable plates 840 can be configured with an oscillating current signal. In a specific embodiment, plates 840 can be subjected to an external magnetic field, which can cause an output of a capacitance measurement between electrodes 830. In an embodiment, the external magnetic field causes moving plates 840 to defect in a direction perpendicular to the magnetic field and the oscillating current signal. Additionally, each of electrodes 830 can be configured to be drive devices or sensing devices. In various embodiments, plates 840 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

Plates 840 and electrodes 850 are integrated with common semiconductor layer 820 on top of common substrate layer 810. In an embodiment, common semiconductor layer 820 can be made of a silicon material or any other appropriate semiconductor. Semiconductor layer 820 can include a CMOS layer or any other appropriate layer for implementing microelectronics. CMOS layer 820 includes a surface region which forms an interface region 830, on which the electronic compass can be configured. Further details of various integration techniques of the component layers and devices are provided below.

In various embodiments, semiconductor layer 820 can include a CMOS layer comprised of any number of metal layers and can be provided on any type of design rule, such as a 0.18 micron design rule (or 0.11 micron or 90 nm or 70 nm or 55 nm) or less. Also, interface region 830 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 9:
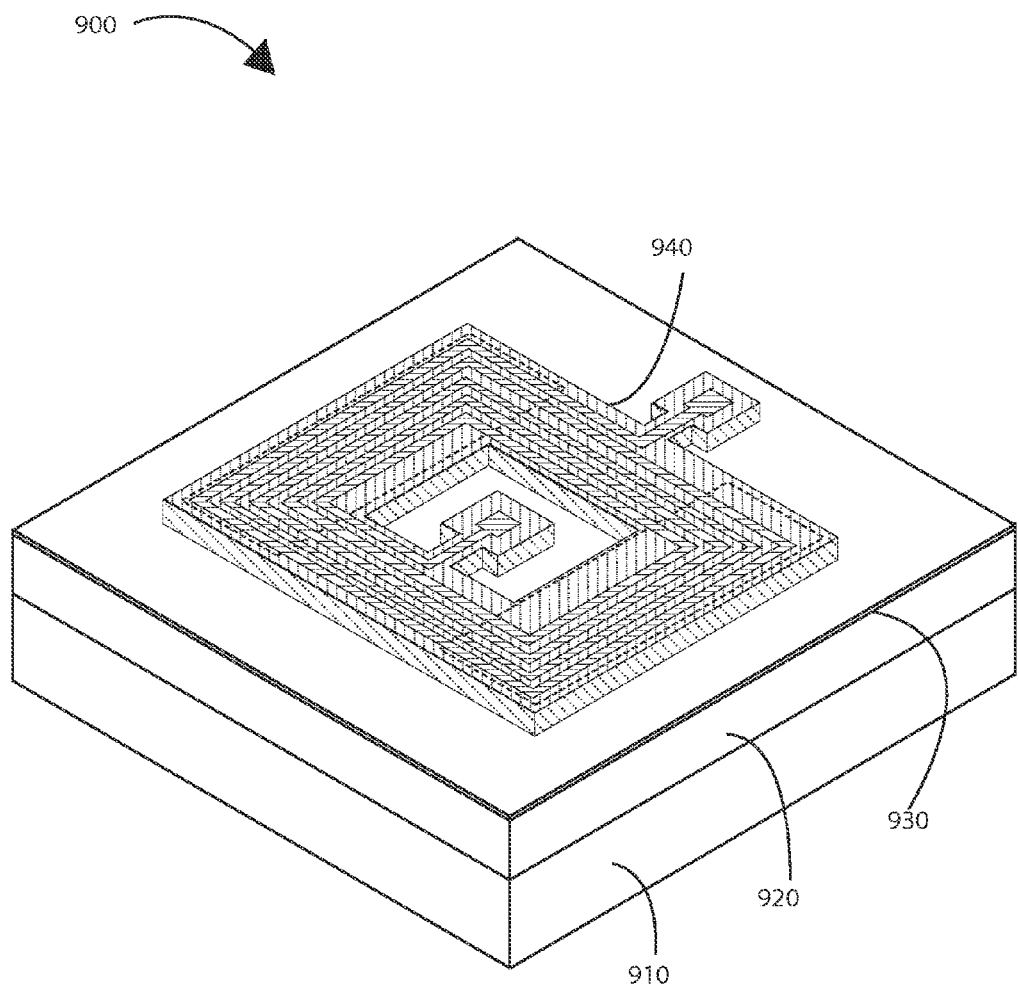
FIG. 9 is a simplified perspective diagram of an electronic compass configuration according to an embodiment of the present invention.

FIG. 9 is a simplified perspective diagram of an electronic compass configuration according to an embodiment of the present invention. This diagram is merely an example, which should not unduly limit the scope of the claims herein. One of ordinary skill in the art would recognize other variations, modifications, and alternatives. As shown, system 900 includes a substrate layer 910, a semiconductor layer 920, and an electronic compass configuration 960. One of ordinary skill in the art will recognize other variations, modifications, and alternatives.

In an embodiment, the electronic compass configuration includes movable plates 940 and electrodes 950. Each of movable plates 940 can be configured with an oscillating current signal. In a specific embodiment, plates 940 can be subjected to an external magnetic field, which can cause an output of a capacitance measurement between electrodes 930. In an embodiment, the external magnetic field causes moving plates 940 to defect in a direction perpendicular to the magnetic field and the oscillating current signal. Additionally, each of electrodes 930 can be configured to be drive devices or sensing devices. In various embodiments, plates 940 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

The plates and electrodes are integrated with common semiconductor layer 920 on top of common substrate layer 910. In an embodiment, common semiconductor layer 920 can be made of a silicon material or any other appropriate semiconductor. Semiconductor layer 920 can include a CMOS layer or any other appropriate layer for implementing microelectronics. CMOS layer 920 includes a surface region which forms an interface region 930, on which the electronic compass can be configured. Further details of various integration techniques of the component layers and devices are provided below.

In various embodiments, semiconductor layer 920 can include a CMOS layer comprised of any number of metal layers and can be provided on any type of design rule, such as a 0.18 micron design rule (or 0.11 micron or 90 nm or 70 nm or 55 nm) or less. Also, interface region 930 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

A comparative study of several embodiments of the present invention has shown several advantages. Resistivity of the device was found to be 2.90 uOhm-cm (using Al) and 5.60 uOhm-cm (2-folded using W). Thickness of the device was found to be 0.80 um using Al and 24.0 um (30-folded) with W. Sheet R was found to be 3.5e-2 Ohm with Al and 0.23 e-2 Ohm (1/15-folded). 3.3 kOhm 1 um line for 100 uA current with 3.3V required 100,000 um Al and 1,500,000 um W. In an embodiment, reported testing results showed the device size to be 500×500 um. A bias voltage of 3.3V and a bias current of 100 uA was used. The vacuum level was 0.2 mbar/20 Pa/150 mTorr. The resolution was 0.5 deg; 60 nT (10 mT earth). Linearity was 1% and TC of sensitivity was 1%/degC (can be trimmed by using linear T compensation).

In various embodiments, several design improvements can be used. Stress induced by W routings can deform Si structures. Stress decoupling techniques developed for accelerometer devices or other MEMS devices can be used. The device should still function even without decoupling due to its symmetric nature. Electrodes can be implemented by sliding combs instead of gap closures. This technique can increase Q value significantly due to lowered air damping. Hinge structures with tungsten could lower Q value due to the material's nature and thermo-elastic damping. A special hinge design can be used to ease thermo-elastic damping. Low sheet resistance of thick tungsten routing can help to lower the required current and thus, power consumption, significantly. Those skilled in the art will recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 10:
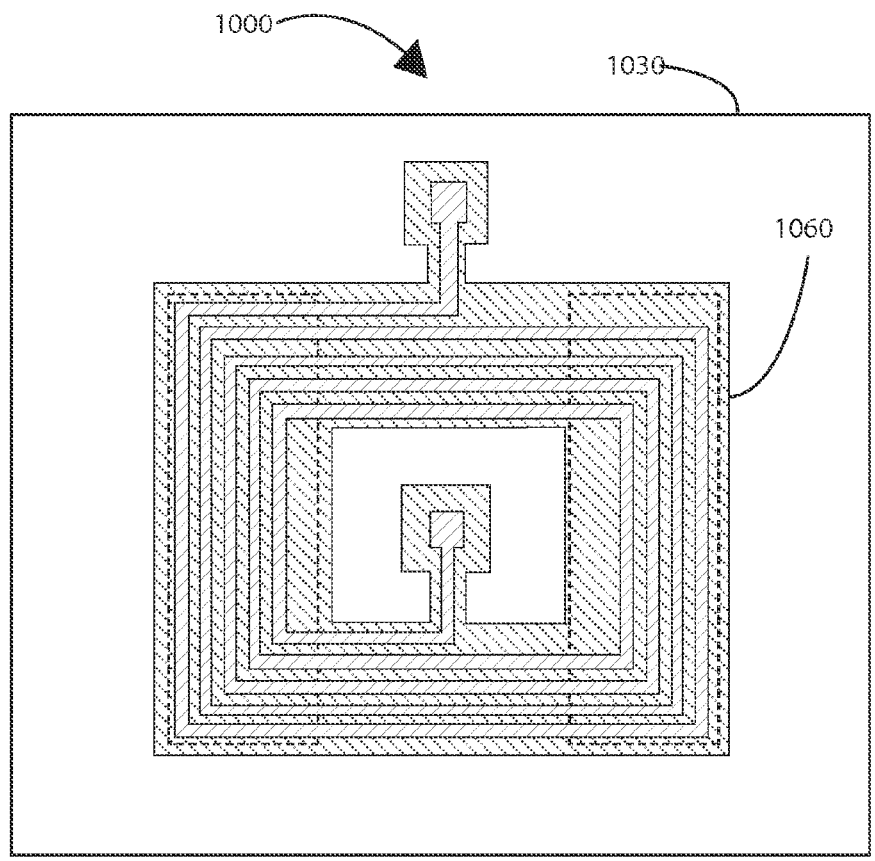
FIG. 10 is a simplified perspective diagram of an electronic compass configuration according to an embodiment of the present invention.

FIG. 10 is a simplified top diagram of an electronic compass configuration according to an embodiment of the present invention. This diagram is merely an example, which should not unduly limit the scope of the claims herein. One of ordinary skill in the art would recognize other variations, modifications, and alternatives. As shown, system 1000 includes an interface region 1030 and an electronic compass configuration 1060. One of ordinary skill in the art will recognize other variations, modifications, and alternatives.

In an embodiment, the electronic compass configuration includes movable plates and electrodes. Each of the movable plates can be configured with an oscillating current signal. In a specific embodiment, the plates can be subjected to an external magnetic field, which can cause an output of a capacitance measurement between the electrodes. In an embodiment, the external magnetic field causes the moving plates to defect in a direction perpendicular to the magnetic field and the oscillating current signal. Additionally, each of the electrodes can be configured to be drive devices or sensing devices. In various embodiments, the plates can output a reference current that can be provided for one or more sensing devices. Additionally, those electrodes configured to be sensing devices can include one or more amplifier devices, which can be configured to output one or more DC signals. Of course, there can be other variations, modifications, and alternatives.

In various embodiments, the semiconductor layer can include a CMOS layer comprised of any number of metal layers and can be provided on any type of design rule, such as a 0.18 micron design rule (or 0.11 micron or 90 nm or 70 nm or 55 nm) or less. Also, interface region 1030 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 11:
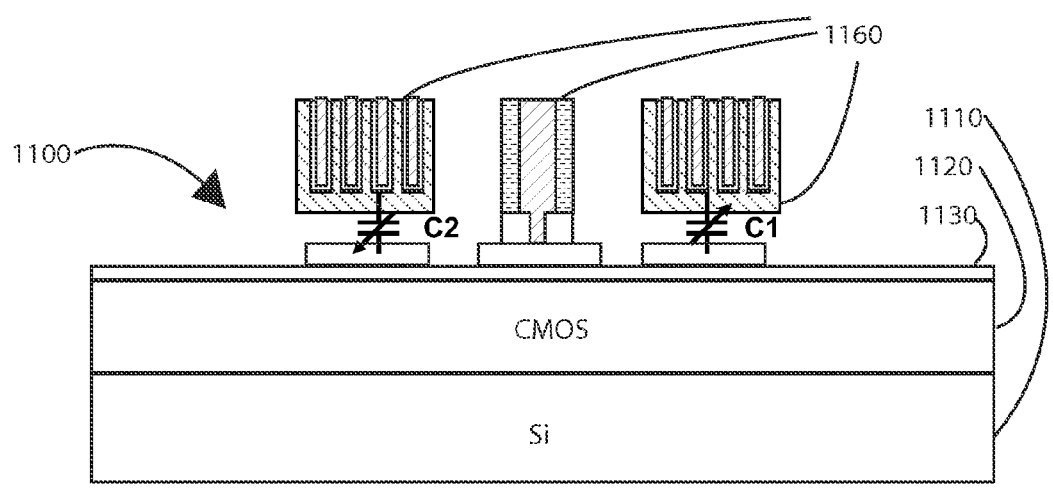
FIG. 11 is a simplified top diagram of an electronic compass configuration according to an embodiment of the present invention.

FIG. 11 is a simplified side diagram of an electronic compass configuration according to an embodiment of the present invention. This diagram is merely an example, which should not unduly limit the scope of the claims herein. One of ordinary skill in the art would recognize other variations, modifications, and alternatives. As shown, system 1100 includes a substrate layer 1110, a semiconductor layer 1120, and an electronic compass configuration 1160. One of ordinary skill in the art will recognize other variations, modifications, and alternatives.

In an embodiment, the electronic compass configuration includes movable plates and electrodes. Each of the movable plates can be configured with an oscillating current signal. In a specific embodiment, the plates can be subjected to an external magnetic field, which can cause an output of a capacitance measurement between the electrodes. In an embodiment, the external magnetic field causes the moving plates to defect in a direction perpendicular to the magnetic field and the oscillating current signal. Additionally, each of the electrodes can be configured to be drive devices or sensing devices. In various embodiments, the plates can output a reference current that can be provided for one or more sensing devices. Additionally, those electrodes configured to be sensing devices can include one or more amplifier devices, which can be configured to output one or more DC signals. Of course, there can be other variations, modifications, and alternatives.

The plates and electrodes are integrated with common semiconductor layer 1120 on top of common substrate layer 1110. In an embodiment, common semiconductor layer 1120 can be made of a silicon material or any other appropriate semiconductor. Semiconductor layer 1120 can include a CMOS layer or any other appropriate layer for implementing microelectronics. CMOS layer 1120 includes a surface region which forms an interface region 1130, on which the electronic compass can be configured. Further details of various integration techniques of the component layers and devices are provided below.

In various embodiments, semiconductor layer 1120 can include a CMOS layer comprised of any number of metal layers and can be provided on any type of design rule, such as a 0.18 micron design rule (or 0.11 micron or 90 nm or 70 nm or 55 nm) or less. Also, interface region 1130 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 12:
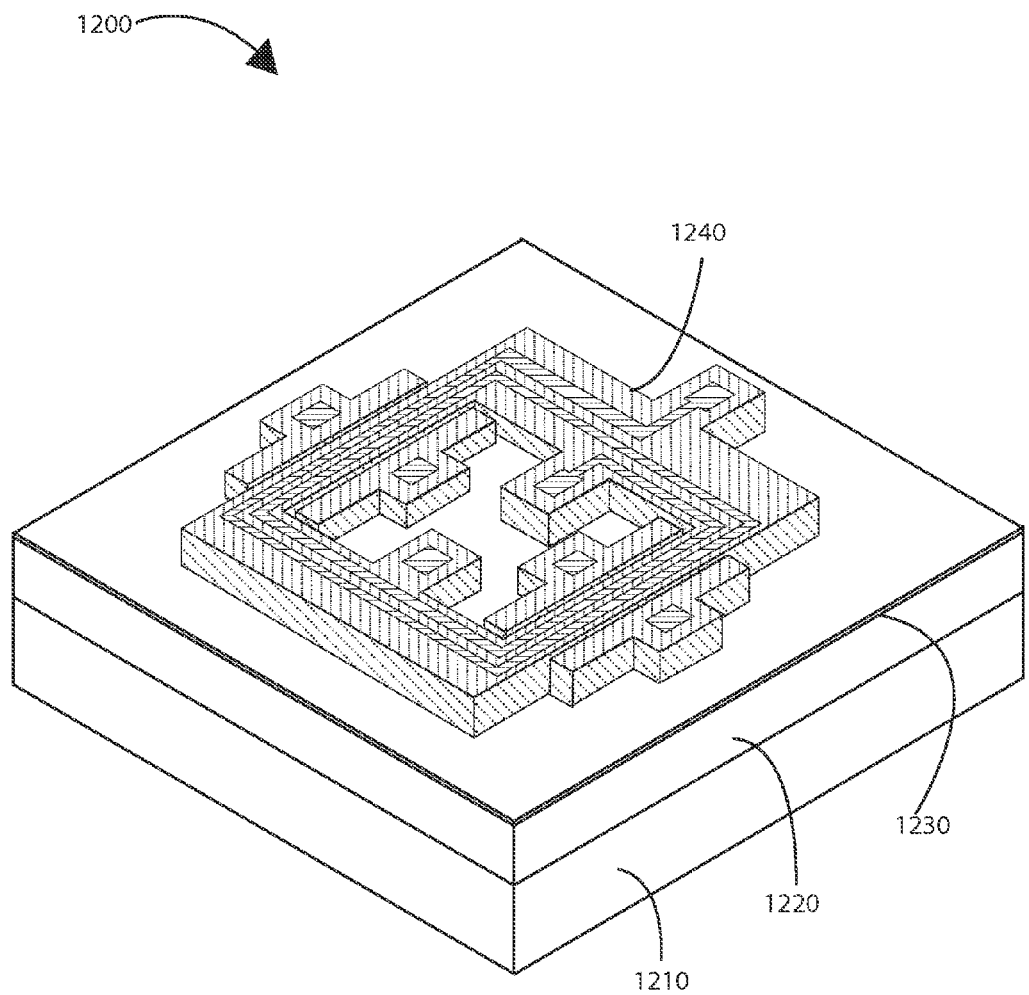
FIG. 12 is a simplified top diagram of an electronic compass configuration according to an embodiment of the present invention.

FIG. 12 is a simplified perspective diagram of an electronic compass configuration according to an embodiment of the present invention. This diagram is merely an example, which should not unduly limit the scope of the claims herein. One of ordinary skill in the art would recognize other variations, modifications, and alternatives. As shown, system 1200 includes a substrate layer 1210, a semiconductor layer 1220, and an electronic compass configuration 1260. One of ordinary skill in the art will recognize other variations, modifications, and alternatives.

In an embodiment, the electronic compass configuration includes movable plates and electrodes. Each of the movable plates can be configured with an oscillating current signal. In a specific embodiment, the plates can be subjected to an external magnetic field, which can cause an output of a capacitance measurement between the electrodes. In an embodiment, the external magnetic field causes the moving plates to defect in a direction perpendicular to the magnetic field and the oscillating current signal. Additionally, each of the electrodes can be configured to be drive devices or sensing devices. In various embodiments, the plates can output a reference current that can be provided for one or more sensing devices. Additionally, those electrodes configured to be sensing devices can include one or more amplifier devices, which can be configured to output one or more DC signals. Of course, there can be other variations, modifications, and alternatives.

The plates and electrodes are integrated with common semiconductor layer 1220 on top of common substrate layer 1210. In an embodiment, common semiconductor layer 1220 can be made of a silicon material or any other appropriate semiconductor. Semiconductor layer 1220 can include a CMOS layer or any other appropriate layer for implementing microelectronics. CMOS layer 1220 includes a surface region which forms an interface region 1230, on which the electronic compass can be configured. Further details of various integration techniques of the component layers and devices are provided below.

In various embodiments, semiconductor layer 1220 can include a CMOS layer comprised of any number of metal layers and can be provided on any type of design rule, such as a 0.18 micron design rule (or 0.11 micron or 90 nm or 70 nm or 55 nm) or less. Also, interface region 1230 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 13:
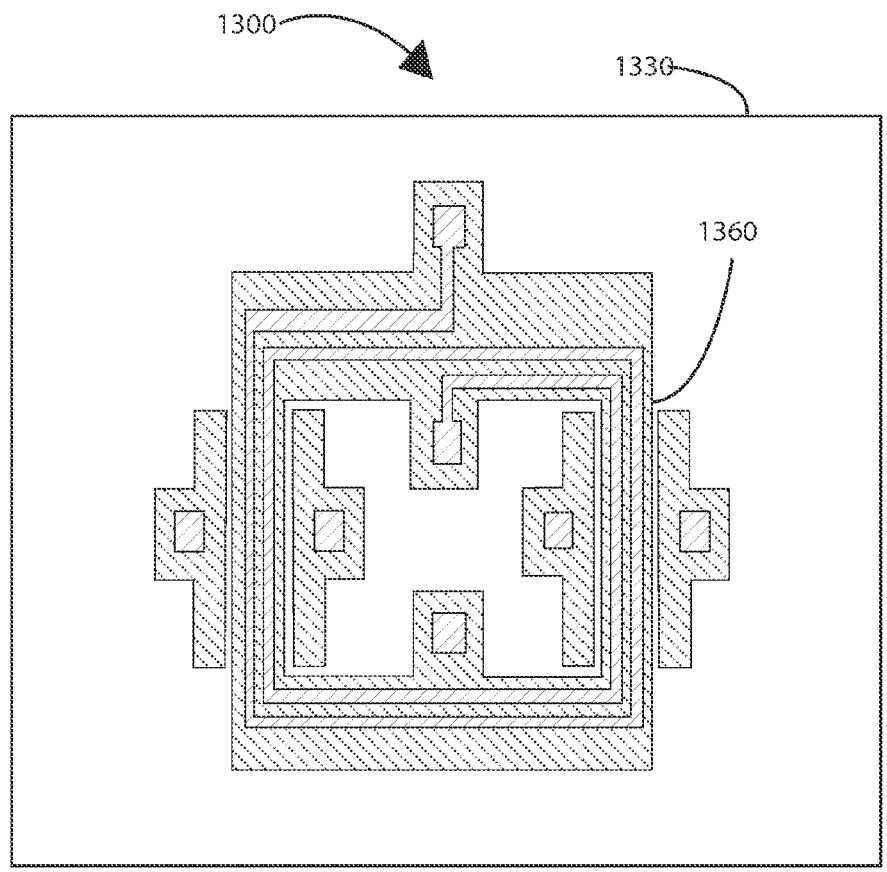
FIG. 13 is a simplified side diagram of an electronic compass configuration according to an embodiment of the present invention.

FIG. 13 is a simplified top diagram of an electronic compass configuration according to an embodiment of the present invention. This diagram is merely an example, which should not unduly limit the scope of the claims herein. One of ordinary skill in the art would recognize other variations, modifications, and alternatives. As shown, system 1300 includes an interface region 1330 and an electronic compass configuration 1360. One of ordinary skill in the art will recognize other variations, modifications, and alternatives.

In an embodiment, the electronic compass configuration includes movable plates and electrodes. Each of the movable plates can be configured with an oscillating current signal. In a specific embodiment, the plates can be subjected to an external magnetic field, which can cause an output of a capacitance measurement between the electrodes. In an embodiment, the external magnetic field causes the moving plates to defect in a direction perpendicular to the magnetic field and the oscillating current signal. Additionally, each of the electrodes can be configured to be drive devices or sensing devices. In various embodiments, the plates can output a reference current that can be provided for one or more sensing devices. Additionally, those electrodes configured to be sensing devices can include one or more amplifier devices, which can be configured to output one or more DC signals. Of course, there can be other variations, modifications, and alternatives.

In various embodiments, the semiconductor layer can include a CMOS layer comprised of any number of metal layers and can be provided on any type of design rule, such as a 0.18 micron design rule (or 0.11 micron or 90 nm or 70 nm or 55 nm) or less. Also, interface region 1330 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 14:
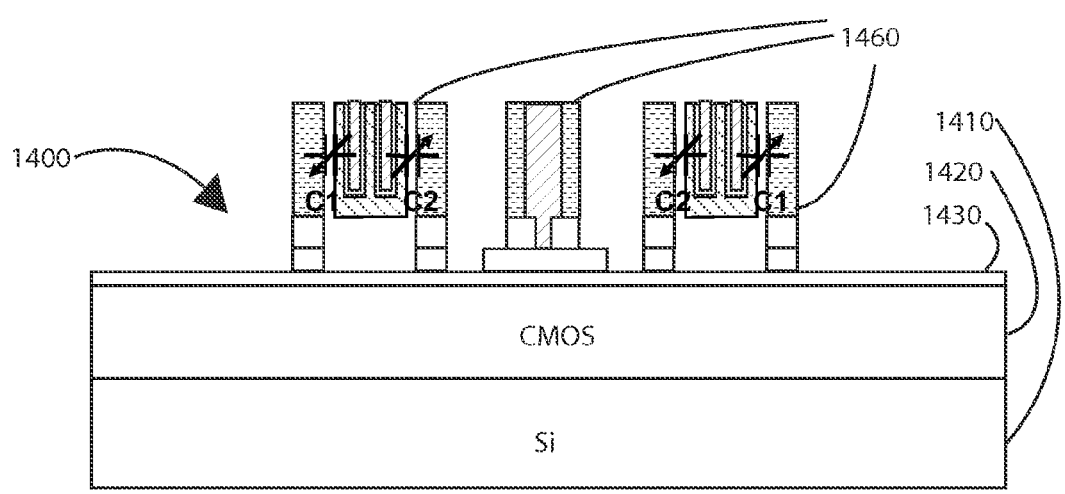
FIG. 14 is a simplified side diagram of an electronic compass configuration according to an embodiment of the present invention.

FIG. 14 is a simplified side diagram of an electronic compass configuration according to an embodiment of the present invention. This diagram is merely an example, which should not unduly limit the scope of the claims herein. One of ordinary skill in the art would recognize other variations, modifications, and alternatives. As shown, the system 1400 includes a substrate layer 1410, a semiconductor layer 1420, and a electronic compass configuration 1460. One of ordinary skill in the art will recognize other variations, modifications, and alternatives.

In an embodiment, the electronic compass configuration includes movable plates and electrodes. Each of the movable plates can be configured with an oscillating current signal. In a specific embodiment, the plates can be subjected to an external magnetic field, which can cause an output of a capacitance measurement between the electrodes. In an embodiment, the external magnetic field causes the moving plates to defect in a direction perpendicular to the magnetic field and the oscillating current signal. Additionally, each of the electrodes can be configured to be drive devices or sensing devices. In various embodiments, the plates can output a reference current that can be provided for one or more sensing devices. Additionally, those electrodes configured to be sensing devices can include one or more amplifier devices, which can be configured to output one or more DC signals. Of course, there can be other variations, modifications, and alternatives.

The plates and electrodes are integrated with common semiconductor layer 1420 on top of common substrate layer 1410. In an embodiment, common semiconductor layer 1420 can be made of a silicon material or any other appropriate semiconductor. Semiconductor layer 1420 can include a CMOS layer or any other appropriate layer for implementing microelectronics. CMOS layer 1420 includes a surface region which forms an interface region 1430, on which the electronic compass can be configured. Further details of various integration techniques of the component layers and devices are provided below.

In various embodiments, semiconductor layer 1420 can include a CMOS layer comprised of any number of metal layers and can be provided on any type of design rule, such as a 0.18 micron design rule (or 0.11 micron or 90 nm or 70 nm or 55 nm) or less. Also, interface region 1430 formed by the semiconductor layer can be integrated with any number of CMOS devices, which can be configured from a foundry compatible process, such as those of semiconductor foundry operations of Taiwan Semiconductor Manufacturing Corporation, and others. In an embodiment, the electronic compass device can be coupled to the integrated CMOS circuits using one or more via structures. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 15:
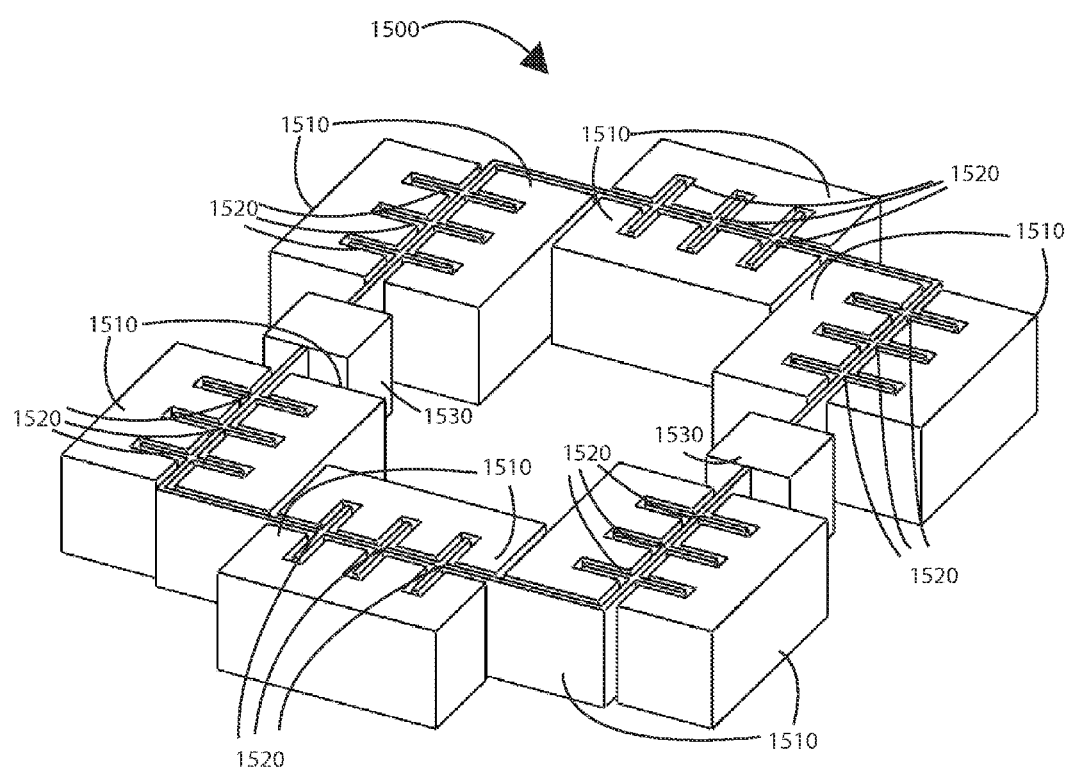
FIG. 15 is a simplified perspective diagram of an electronic compass configuration according to an embodiment of the present invention.

FIG. 15 is a simplified perspective diagram of an electronic compass configuration according to an embodiment of the present invention. This diagram is merely an example, which should not unduly limit the scope of the claims herein. One of ordinary skill in the art would recognize other variations, modifications, and alternatives. As shown, system 1500 includes a semiconductor substrate, CMOS integrated circuits, and an electronic compass configuration. In an embodiment, the electronic compass configuration can be a micromechanical electronic system, which can be coupled to one or more amplifier devices. Of course, there can be variations, modifications, and alternatives.

In an embodiment, the electronic compass configuration includes movable plates 1520, electrodes 1510, and anchors 1530. Each of movable plates 1520 can be configured with an oscillating current signal. Additionally, the movable plates 1520 can be coupled to anchors 1530. In a specific embodiment, plates 1520 can be subjected to an external magnetic field, which can cause an output of a capacitance measurement between electrodes 1510. In an embodiment, the external magnetic field causes moving plates 1520 to defect in a direction perpendicular to the magnetic field and the oscillating current signal. Additionally, each of electrodes 1510 can be configured to be drive devices or sensing devices. In various embodiments, plates 1520 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 16:
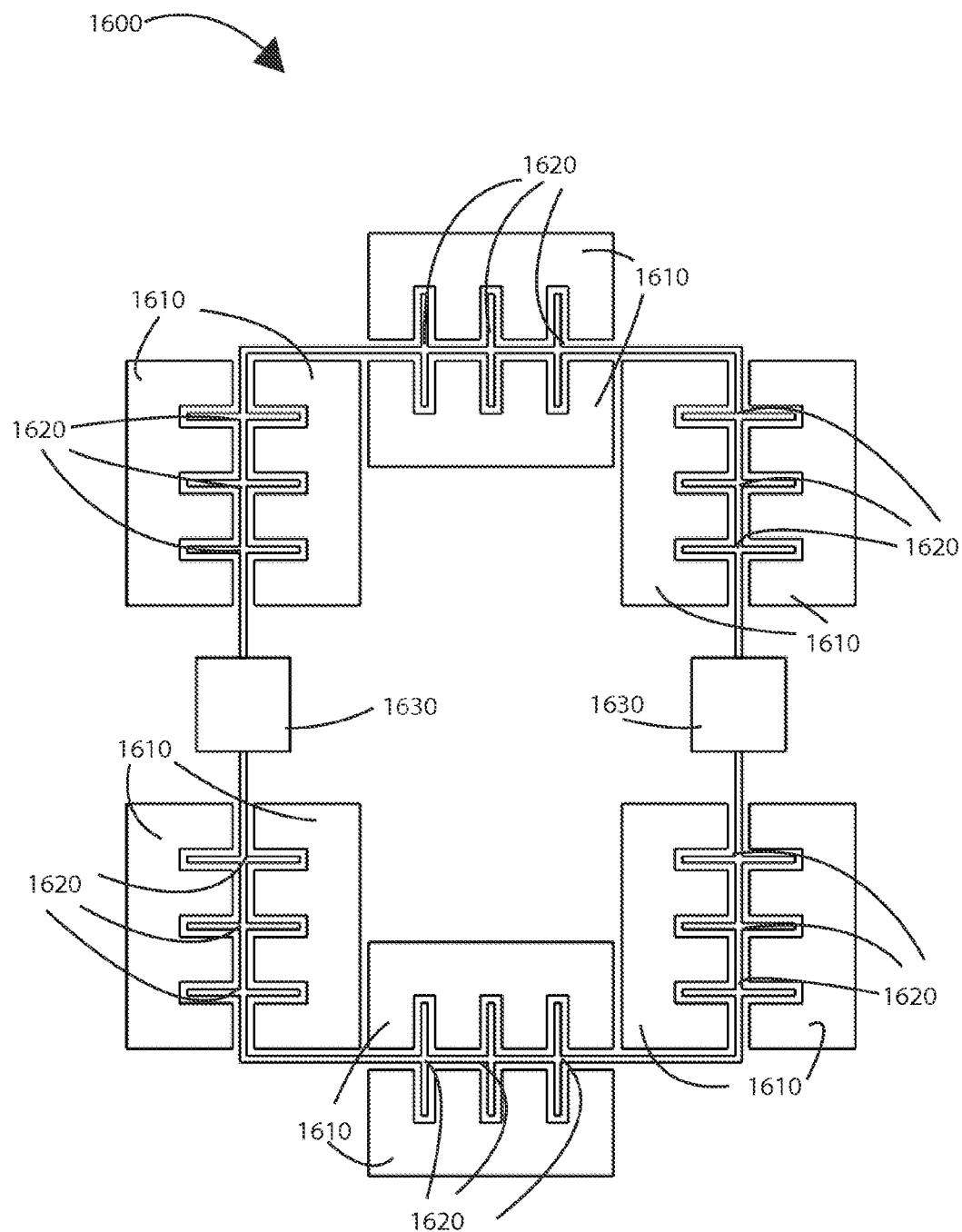
FIG. 16 is a simplified top diagram of an electronic compass configuration according to an embodiment of the present invention.

FIG. 16 is a simplified top diagram of an electronic compass configuration according to an embodiment of the present invention. This diagram is merely an example, which should not unduly limit the scope of the claims herein. One of ordinary skill in the art would recognize other variations, modifications, and alternatives. As shown, system 1600 includes a semiconductor substrate, CMOS integrated circuits, and an electronic compass configuration. In an embodiment, the electronic compass configuration can be a micro-mechanical electronic system, which can be coupled to one or more amplifier devices. Of course, there can be variations, modifications, and alternatives.

In an embodiment, the electronic compass configuration includes movable plates 1620, electrodes 1610, and anchors 1630. Each of movable plates 1620 can be configured with an oscillating current signal. Additionally, the movable plates 1620 can be coupled to anchors 1630. In a specific embodiment, plates 1620 can be subjected to an external magnetic field, which can cause an output of a capacitance measurement between electrodes 1610. In an embodiment, the external magnetic field causes moving plates 1620 to defect in a direction perpendicular to the magnetic field and the oscillating current signal. Additionally, each of electrodes 1610 can be configured to be drive devices or sensing devices. In various embodiments, plates 1620 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 17:
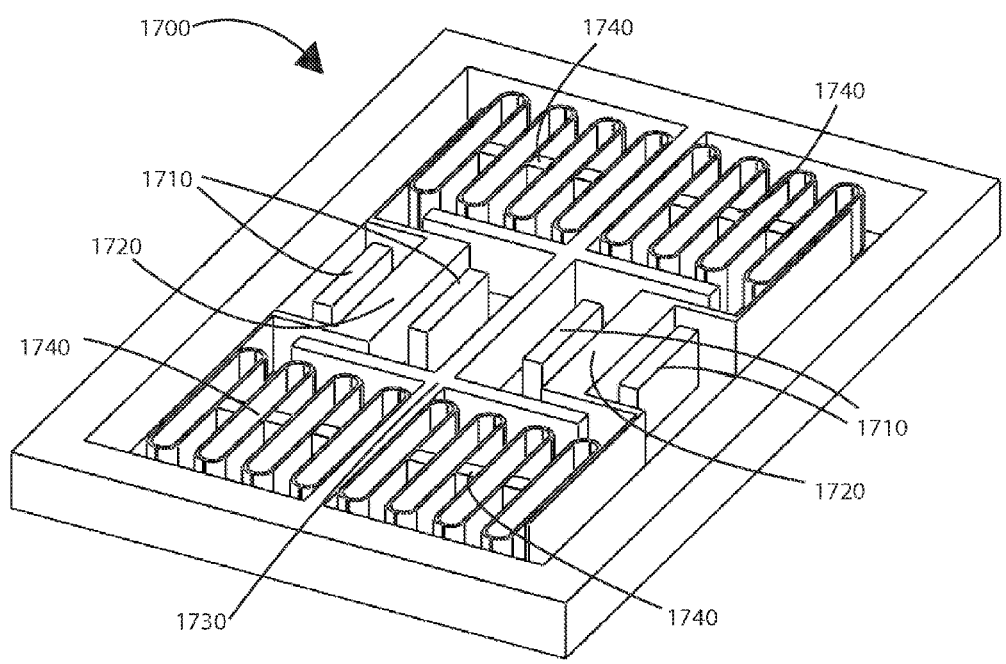
FIG. 17 is a simplified perspective diagram of an electronic compass configuration according to an embodiment of the present invention.

FIG. 17 is a simplified perspective diagram of an electronic compass configuration according to an embodiment of the present invention. This diagram is merely an example, which should not unduly limit the scope of the claims herein. One of ordinary skill in the art would recognize other variations, modifications, and alternatives. As shown, system 1700 includes a semiconductor substrate, CMOS integrated circuits, and an electronic compass configuration. In an embodiment, the electronic compass configuration can be a micro-mechanical electronic system, which can be coupled to one or more amplifier devices. Of course, there can be variations, modifications, and alternatives.

In an embodiment, the electronic compass configuration includes movable plates 1720, electrodes 1710, springs 1740, and a frame 1730. Each of movable plates 1720 can be configured with an oscillating current signal. Additionally, the plates 1720 can be coupled to both frame 1730 and one or more springs 1740. In a specific embodiment, plates 1720 can be subjected to an external magnetic field, which can cause an output of a capacitance measurement between electrodes 1710. In an embodiment, the external magnetic field causes moving plates 1720 to defect in a direction perpendicular to the magnetic field and the oscillating current signal. Additionally, each of electrodes 1710 can be configured to be drive devices or sensing devices. In various embodiments, plates 1720 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 18:
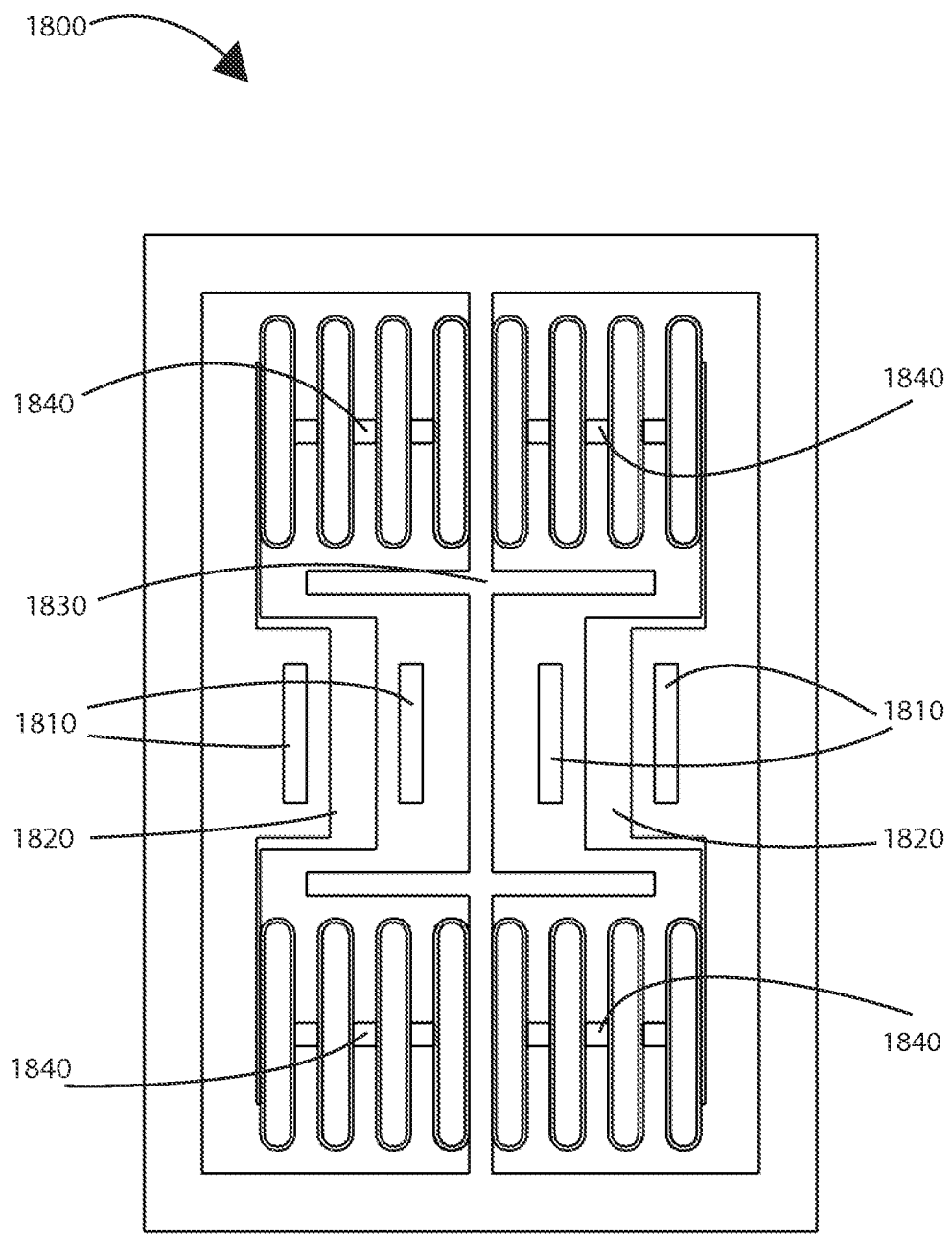
FIG. 18 is a simplified top diagram of an electronic compass configuration according to an embodiment of the present invention.

FIG. 18 is a simplified top diagram of an electronic compass configuration according to an embodiment of the present invention. This diagram is merely an example, which should not unduly limit the scope of the claims herein. One of ordinary skill in the art would recognize other variations, modifications, and alternatives. As shown, system 1800 includes a semiconductor substrate, CMOS integrated circuits, and an electronic compass configuration. In an embodiment, the electronic compass configuration can be a micro-mechanical electronic system, which can be coupled to one or more amplifier devices. Of course, there can be variations, modifications, and alternatives.

In an embodiment, the electronic compass configuration includes movable plates 1820, electrodes 1810, springs 1840, and a frame 1830. Each of movable plates 1820 can be configured with an oscillating current signal. Additionally, the plates 1820 can be coupled to both frame 1830 and one or more springs 1840. In a specific embodiment, plates 1820 can be subjected to an external magnetic field, which can cause an output of a capacitance measurement between electrodes 1810. In an embodiment, the external magnetic field causes moving plates 1820 to defect in a direction perpendicular to the magnetic field and the oscillating current signal. Additionally, each of electrodes 1810 can be configured to be drive devices or sensing devices. In various embodiments, plates 1820 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 19:
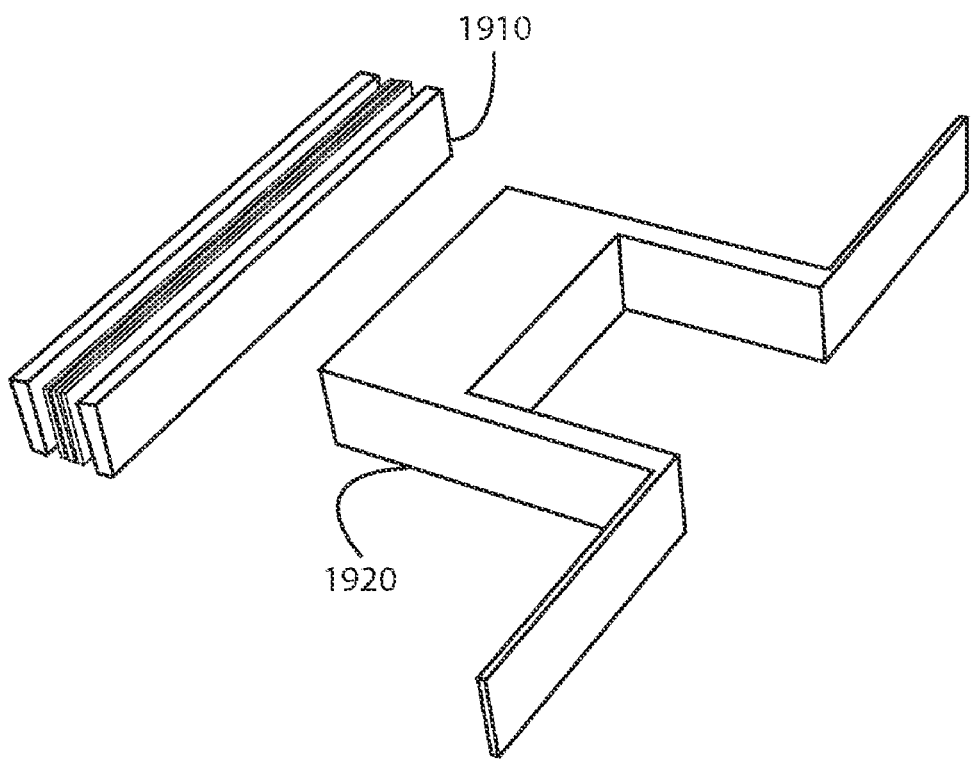
FIG. 19 is a simplified perspective diagram of an electronic compass configuration according to an embodiment of the present invention.

FIG. 19 is a simplified perspective diagram of an electronic compass configuration according to an embodiment of the present invention. This diagram is merely an example, which should not unduly limit the scope of the claims herein. One of ordinary skill in the art would recognize other variations, modifications, and alternatives. As shown, system 1900 includes a semiconductor substrate, CMOS integrated circuits, and an electronic compass configuration. In an embodiment, the electronic compass configuration can be a micro-mechanical electronic system, which can be coupled to one or more amplifier devices. Of course, there can be variations, modifications, and alternatives.

In an embodiment, the electronic compass configuration includes movable plates 1920 and electrodes 1910. Each of movable plates 1920 can be configured with an oscillating current signal. In a specific embodiment, plates 1920 can be subjected to an external magnetic field, which can cause an output of a capacitance measurement between electrodes 1910. In an embodiment, the external magnetic field causes moving plates 1920 to defect in a direction perpendicular to the magnetic field and the oscillating current signal. Additionally, each of electrodes 1910 can be configured to be drive devices or sensing devices. In various embodiments, plates 1920 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 20:
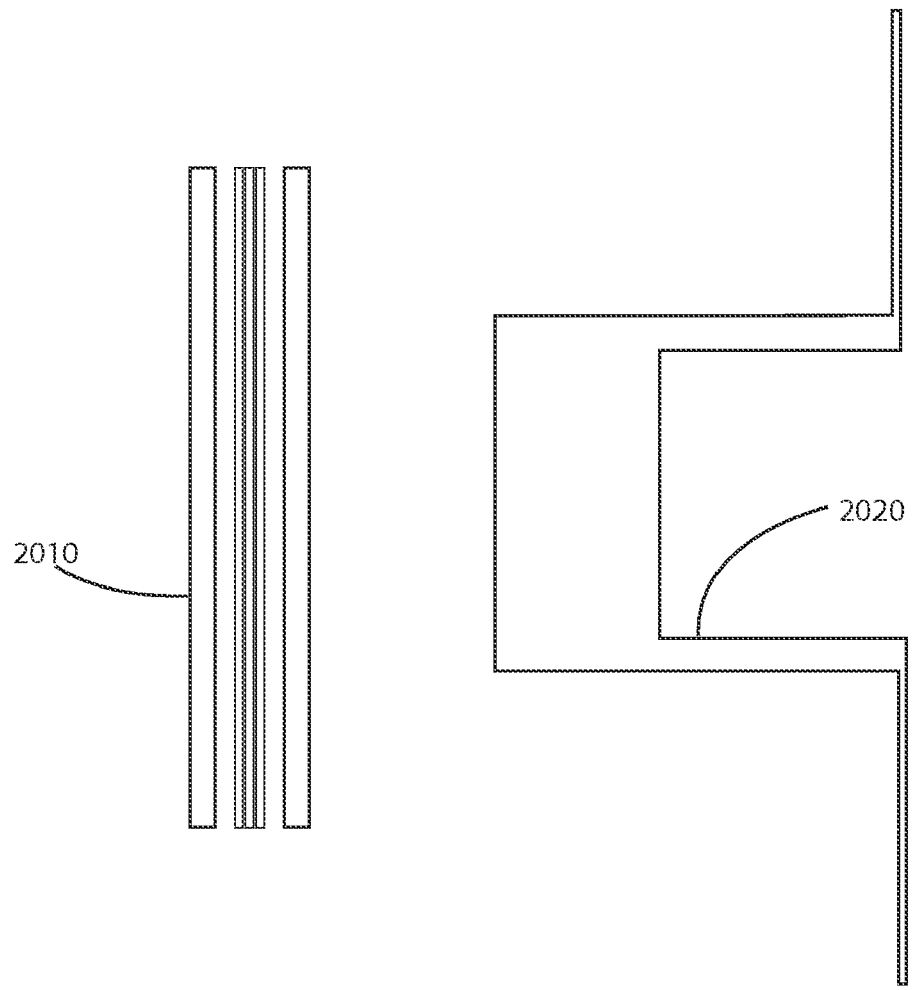
FIG. 20 is a simplified side diagram of an electronic compass configuration according to an embodiment of the present invention.

FIG. 20 is a simplified perspective diagram of an electronic compass configuration according to an embodiment of the present invention. This diagram is merely an example, which should not unduly limit the scope of the claims herein. One of ordinary skill in the art would recognize other variations, modifications, and alternatives. As shown, system 2000 includes a semiconductor substrate, CMOS integrated circuits, and an electronic compass configuration. In an embodiment, the electronic compass configuration can be a micromechanical electronic system, which can be coupled to one or more amplifier devices. Of course, there can be variations, modifications, and alternatives.

In an embodiment, the electronic compass configuration includes movable plates 2020 and electrodes 2010. Each of movable plates 2020 can be configured with an oscillating current signal. In a specific embodiment, plates 2020 can be subjected to an external magnetic field, which can cause an output of a capacitance measurement between electrodes 2010. In an embodiment, the external magnetic field causes moving plates 2020 to defect in a direction perpendicular to the magnetic field and the oscillating current signal. Additionally, each of electrodes 2010 can be configured to be drive devices or sensing devices. In various embodiments, plates 2020 can output a reference current that can be provided for one or more sensing devices. Additionally, those electrodes configured to be sensing devices can include one or more amplifier devices, which can be configured to output one or more DC signals. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 21:
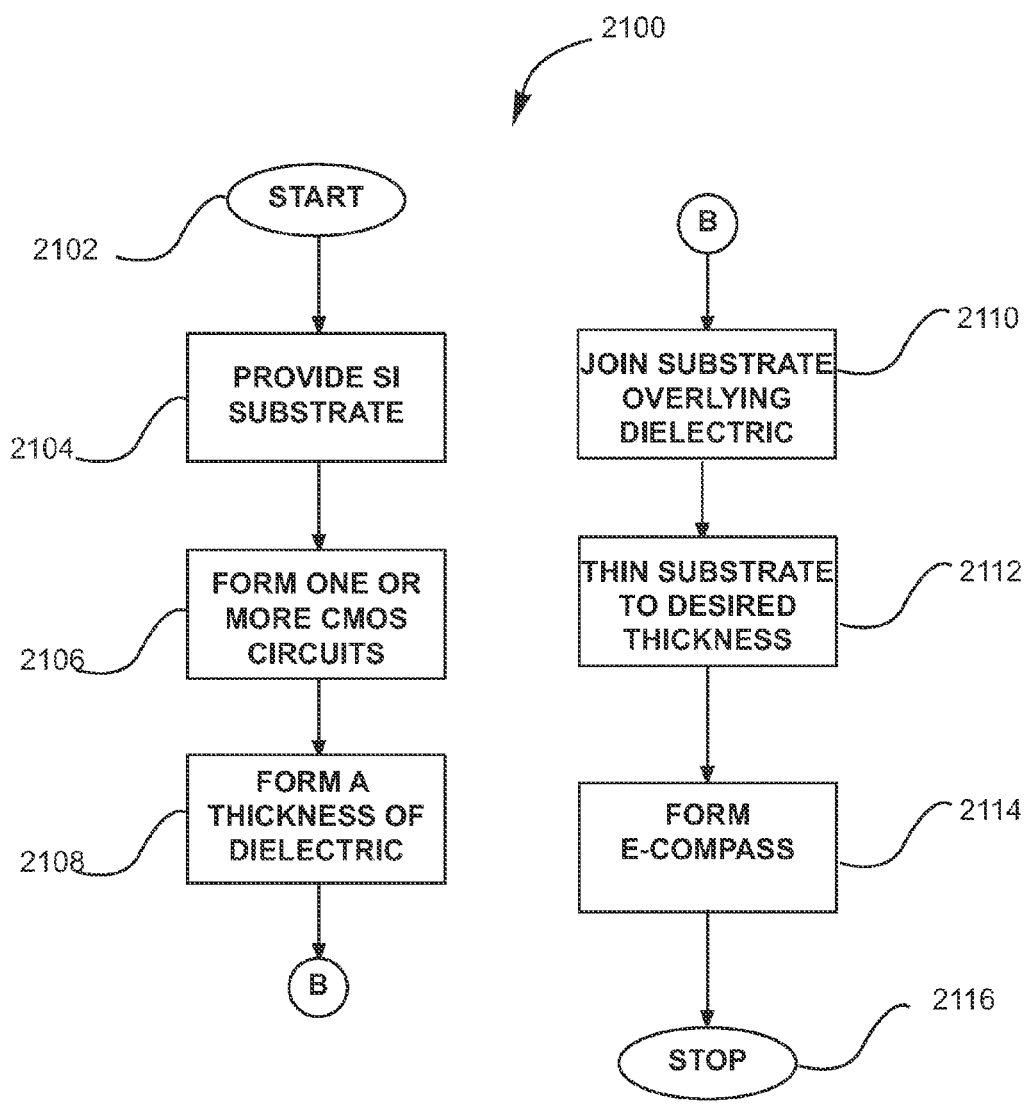
FIG. 21 is a simplified flow diagram illustrating a method of fabricating an integrated electronic compass and circuit device according to an embodiment of the present invention.

FIG. 21 is a simplified flow diagram illustrating a method of fabricating an integrated electronic compass and circuit device according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 21, the present method can be briefly outlined below.

1. Start;
2. Provide a semiconductor substrate comprising a surface region;
3. Form one or more CMOS integrated circuits on one or more portions of the semiconductor substrate;
4. Form a thickness of dielectric material overlying the one or more CMOS integrated circuits;
5. Join a substrate overlying the thickness of dielectric material;
6. Thin the substrate to a predetermined thickness;
7. Form an electronic compass device within one or more regions of the predetermined thickness of the substrate; and
8. Stop.

These steps are merely examples and should not unduly limit the scope of the claims herein. As shown, the above method provides a way of fabricating an integrated electronic compass and circuit device according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 21, method 2100 begins at start, step 2102. The present method provides a fabrication method for forming an integrated electronic compass and circuit device. Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved CMOS integrated circuit device and related methods for a variety of uses. Depending upon the embodiment, one or more of these benefits may be achieved. These and other benefits will be described in more throughout the present specification and more particularly below.

Following step 2102, fabrication method 2100 involves providing a semiconductor substrate comprising a surface region, step 2104. One or more CMOS integrated circuits are then formed on one or more portions of the semiconductor substrate, step 2106. Once the CMOS circuits are formed, a thickness of dielectric material is formed overlying the one or more CMOS integrated circuits, step 2108. A substrate is then joined overlying the thickness of the dielectric material, step 2110. Once joined, the substrate is thinned to a predetermined thickness, step 2112. Following the thinning process, an electric compass device is formed within one or more regions of the predetermined thickness of the substrate, step 2114.

In a specific embodiment, the method can also include forming an accelerometer device within one or more regions of the predetermined thickness of the substrate. In other embodiments, any number of a variety of mechanical devices or MEMS devices can be formed within one or more regions of the predetermined thickness of the substrate. Those of ordinary skill in the art will recognize other variations, modifications, and alternatives.

The above sequence of processes provides a fabrication method for forming an integrated electronic compass and circuit device according to an embodiment of the present invention. As shown, the method uses a combination of steps including providing a substrate, forming CMOS circuits, forming a thickness of a dielectric, joining a substrate overlying the circuits, thinning the substrate, and forming an electronic compass. Other alternatives can also be provided where steps are added, one or more steps are removed, or one or more steps are provided in a different sequence without departing from the scope of the claims herein. Further details of the present method can be found throughout the present specification and more particularly below.

Figure 22:
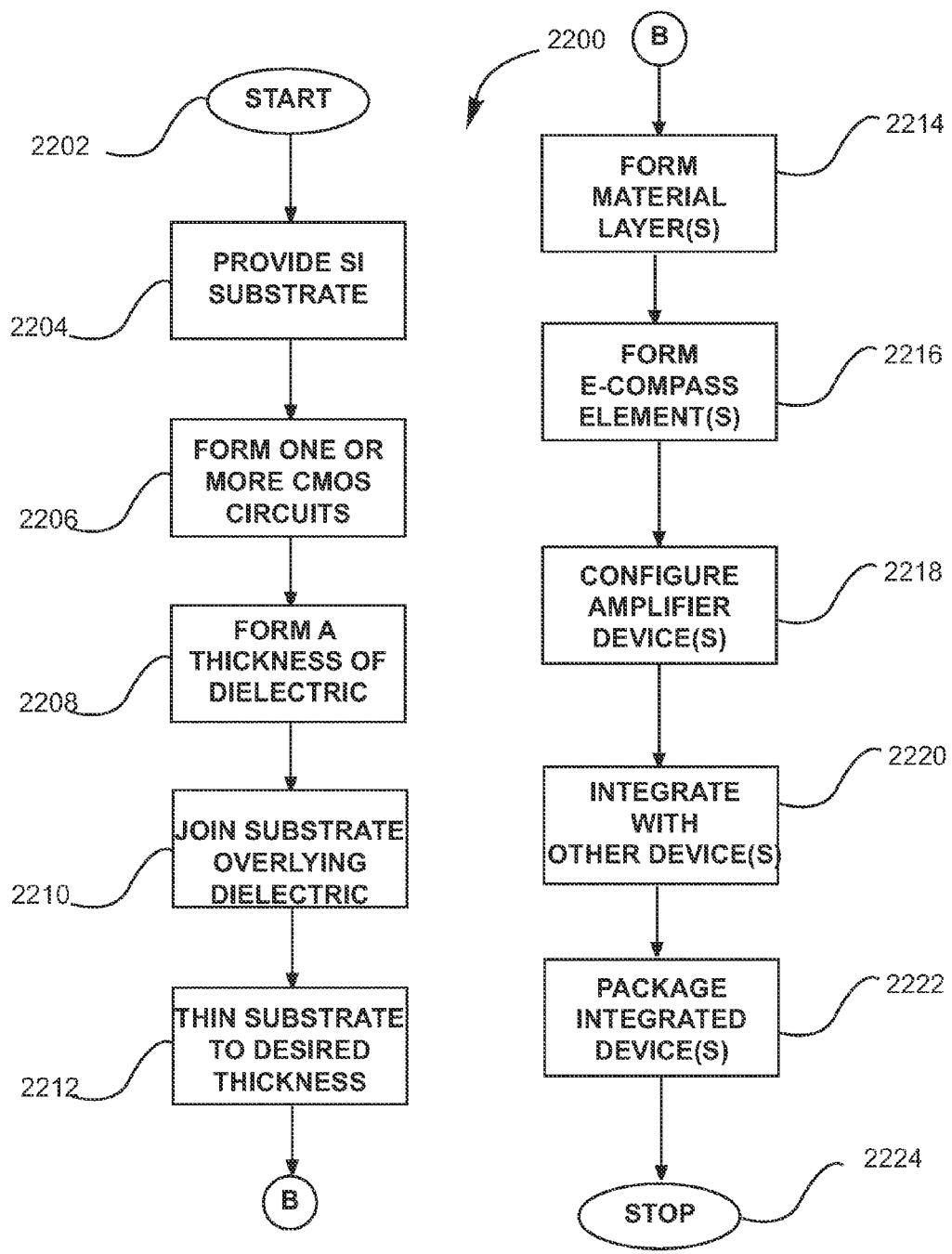
FIG. 22 is a simplified flow diagram illustrating a method of fabricating an integrated electronic compass and circuit device according to an embodiment of the present invention.

FIG. 22 is a simplified flow diagram illustrating a method of fabricating an integrated electronic compass and circuit device according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 22, the present method can be briefly outlined below.

1. Start;
2. Provide a semiconductor substrate comprising a surface region;
3. Form one or more CMOS integrated circuits on one or more portions of the semiconductor substrate;
4. Form a thickness of dielectric material overlying the one or more CMOS integrated circuits;
5. Join a substrate overlying the thickness of dielectric material;
6. Thin the substrate to a predetermined thickness;
7. Form one or more material layers overlying the thinned substrate;
8. Form one or more electronic compass elements from the material layer(s);
9. Configure one or more amplifier devices with the compass element(s)
10. Integrated compass element(s) with other sensor elements/devices;
11. Package integrated electronic compass element(s) and other device(s); and
12. Stop.

These steps are merely examples and should not unduly limit the scope of the claims herein. As shown, the above method provides a way of fabricating an integrated electronic compass and circuit device according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 22, method 2200 begins at start, step 2202. The present method provides a fabrication method for forming an integrated electronic compass and circuit device. Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved CMOS integrated circuit device and related methods for a variety of uses. Depending upon the embodiment, one or more of these benefits may be achieved. These and other benefits will be described in more throughout the present specification and more particularly below.

Following step 2202, fabrication method 2200 involves providing a semiconductor substrate comprising a surface region, step 2204. One or more CMOS integrated circuits are then formed on one or more portions of the semiconductor substrate, step 2206. Once the CMOS circuits are formed, a thickness of dielectric material is formed overlying the one or more CMOS integrated circuits, step 2208. A substrate is then joined overlying the thickness of the dielectric material, step 2210. Once joined, the substrate is thinned to a predetermined thickness, step 2212. Those of ordinary skill in the art will recognize other variations, modifications, and alternatives.

Following the thinning process, one or more material layers can be formed overlying the thinned substrate, step 2214.

In various embodiments, the material layers can include semiconductor materials, metal materials, dielectric materials, or other materials and combinations thereof. The one or more material layers can be used to form one or more electronic compass elements, step 2216. In a specific embodiment, the material layer(s) can be etched to form the one or more e-compass elements. Of course, there can be other variations, modifications, and alternatives.

In a specific embodiment, the electronic compass elements can include movable plates, electrodes, and anchors. Each of the movable plates can be configured with an oscillating current signal. Additionally, the movable plates can be coupled to the anchors. In various embodiments, the plates can be subjected to an external magnetic field, which can cause an output of a capacitance measurement between the electrodes. In an embodiment, the external magnetic field causes the moving plates to defect in a direction perpendicular to the magnetic field and the oscillating current signal. The oscillating current signal can be provided via a resonator device that is coupled to the electronic compass elements. Additionally, each of the electrodes can be configured to be drive devices or sensing devices. The plates can output a reference current that can be provided for one or more sensing devices. Additionally, those electrodes configured to be sensing devices can include one or more amplifier devices, step 2218, which can be configured to output one or more DC signals. Those skilled in the art will recognize other variations, modifications, and alternatives.

In a specific embodiment, the electronic compass elements can include movable plates, electrodes, springs, and a frame. Each of the movable plates can be configured with an oscillating current signal. Additionally, the plates can be coupled to both the frame and one or more springs. In a specific embodiment, the plates can be subjected to an external magnetic field, which can cause an output of a capacitance measurement between the electrodes. In an embodiment, the external magnetic field causes the moving plates to defect in a direction perpendicular to the magnetic field and the oscillating current signal. The oscillating current signal can be provided via a resonator device that is coupled to the electronic compass elements. Additionally, each of the electrodes can be configured to be drive devices or sensing devices. In various embodiments, the plates can output a reference current that can be provided for one or more sensing devices. Additionally, those electrodes configured to be sensing devices can include one or more amplifier devices, step 2218, which can be configured to output one or more DC signals. Again, there can be other variations, modifications, and alternatives.

The electronic compass elements can be configured as one or more electronic compass devices, which can be integrated with other sensors, MEMS devices, or other devices, step 2220. In a specific embodiment, the method can also include forming an accelerometer device within one or more regions of the predetermined thickness of the substrate. In other embodiments, any number of a variety of mechanical devices or MEMS devices can be formed within one or more regions of the predetermined thickness of the substrate. The integrated devices can also be packaged on a single die, step 2222. Those of ordinary skill in the art will recognize other variations, modifications, and alternatives.

The above sequence of processes provides a fabrication method for forming an integrated electronic compass and circuit device according to an embodiment of the present invention. As shown, the method uses a combination of steps including providing a substrate, forming CMOS circuits, forming a thickness of a dielectric, joining a substrate overlying the circuits, thinning the substrate, and forming an electronic compass. Other alternatives can also be provided where steps are added, one or more steps are removed, or one or more steps are provided in a different sequence without departing from the scope of the claims herein. Further details of the present method can be found throughout the present specification and more particularly below.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating an integrated electronic compass and circuit device comprising:
    providing a semiconductor substrate comprising a surface region;
    forming one or more CMOS integrated circuits formed on one or more portions of the semiconductor substrate;
    forming a thickness of dielectric material overlying the one or more CMOS integrated circuits;
    joining a substrate overlying the thickness of dielectric material;
    thinning the substrate to a predetermined thickness; and
    forming an electronic compass device within one or more regions of the predetermined thickness of the substrate.

2. The method of claim 1 further comprising forming an accelerometer device within one or more regions of the predetermined thickness of the substrate.

3. The method of claim 1 wherein the electronic compass device comprises one or more moving plates operably coupled between at least a pair of electrodes, the one or more moving plates being configured with an oscillating current signal, the one or more moving plates being subjected to an external magnetic field to cause output of a capacitance measurement between the pair of electrodes.

4. The method of claim 3 wherein the external magnetic field causes the one or more moving plates to deflect in a direction perpendicular to the magnetic field and the oscillating current signal.

5. The method of claim 1 wherein the electronic compass device is a micro-mechanical electrical system.

6. The method of claim 1 wherein the electronic compass device comprises a micro-mechanical electronic system coupled to one or more amplifier devices.

7. The method of claim 1 wherein the electronic compass device comprises a movable plate for outputting a reference current, the reference current being provided to one or more sensing devices.

8. The method of claim 1 wherein the electronic compass device comprises a movable plate for outputting a reference current, the reference current being provided to one or more sensing devices, the one or more sensing devices being coupled to one or more amplifiers device configured to output one or more DC signals.

9. A method of fabricating an integrated electronic compass and circuit device comprising:
    providing a semiconductor substrate comprising a surface region;
    forming one or more CMOS integrated circuits formed on one or more portions of the semiconductor substrate;
    forming a thickness of dielectric material overlying the one or more CMOS integrated circuits;
    joining a substrate overlying the thickness of dielectric material;
    thinning the substrate to a predetermined thickness;
    forming one or more material layers overlying the thinned substrate; and
    etching the one or more material layers to form and electronic compass device having one or more electronic compass elements.

10. The method of claim 9 further comprising forming an accelerometer device within one or more regions of the predetermined thickness of the substrate.

11. The method of claim 9 wherein the electronic compass device comprises one or more moving plates operably coupled between at least a pair of electrodes, the one or more moving plates being configured with an oscillating current signal, the one or more moving plates being subjected to an external magnetic field to cause output of a capacitance measurement between the pair of electrodes.

12. The method of claim 11 wherein the external magnetic field causes the one or more moving plates to defect in a direction perpendicular to the magnetic field and the oscillating current signal.

13. The method of claim 9 wherein the electronic compass device is a micro-mechanical electrical system.

14. The method of claim 9 wherein the electronic compass device comprises a micro-mechanical electronic system coupled to one or more amplifier devices.

15. The method of claim 9 wherein the electronic compass device comprises a movable plate for outputting a reference current, the reference current being provided to one or more sensing devices.

16. The method of claim 9 wherein the electronic compass device comprises a movable plate for outputting a reference current, the reference current being provided to one or more sensing devices, the one or more sensing devices being coupled to one or more amplifiers device configured to output one or more DC signals.

17. The method of claim 9 wherein the one or more electronic compass elements comprise a frame, one or more movable plates, one or more anchors, and one or more electrodes.

18. The method of claim 9 wherein the one or more electronic compass elements comprise a frame, one or more movable plates, one or more springs, and one or more electrodes.

19. The method of claim 9 further comprising coupling a resonator to the electronic compass device.

20. A method of fabricating an integrated electronic compass and circuit device comprising:
    providing a semiconductor substrate comprising a surface region;
    forming one or more CMOS integrated circuits formed on one or more portions of the semiconductor substrate;
    forming a thickness of dielectric material overlying the one or more CMOS integrated circuits;
    joining a substrate overlying the thickness of dielectric material;
    thinning the substrate to a predetermined thickness; forming one or more material layers overlying the thinned substrate;
    etching the one or more material layers to form an electronic compass device having one or more electronic compass elements;
    coupling a resonator device to the electronic compass devices; integrating the electronic compass device with at least one MEMS device; and packaging the electronic compass device and the MEMS device(s).

* * * * *